(12) United States Patent
Suzuki et al.

(10) Patent No.: US 6,320,464 B1
(45) Date of Patent: Nov. 20, 2001

(54) FEEDFORWARD AMPLIFIER

(75) Inventors: Yasunori Suzuki, Yokohama; Toshio Nojima, Yokosuka, both of (JP)

(73) Assignee: NTT Mobile Communications Network, Inc., Tokyo (JP)

( * ) Notice: Subject to any disclaimer, the term of this patent is extended or adjusted under 35 U.S.C. 154(b) by 0 days.

(21) Appl. No.: 09/538,281

(22) Filed: Mar. 30, 2000

(30) Foreign Application Priority Data

Mar. 13, 1999 (JP) .................................... 11-092355
Jun. 10, 1999 (JP) .................................... 11-163314

(51) Int. Cl.[7] ................. H03F 1/26; H03F 3/66

(52) U.S. Cl. ............................... 330/151; 330/52

(58) Field of Search ............................. 330/52, 149, 151

(56) References Cited

U.S. PATENT DOCUMENTS 5,117,197 * 5/1992 Hsu et al. ................... 330/151 X

* cited by examiner

*Primary Examiner*—Steven J. Mottola
(74) *Attorney, Agent, or Firm*—Connolly Bove Lodge & Hutz LLP

(57) ABSTRACT

In a distortion injection path (15) wherein a detected distortion component of a main amplifier (23) becomes amplified, distortion by an auxiliary amplifier (29a) is detected by an auxiliary distortion detector (42) composed of a variable attenuator (27a), a variable phase shifter (28a), a first auxiliary amplifier (29a), a delay line (36) and a phase inverter (37), and the detected distortion is cancelled by an auxiliary distortion canceller (43) composed of a variable attenuator (27b), a variable phase shifter (28a), a second auxiliary amplifier (29b) and a delay line (39), thereby increasing the efficiency of the amplifier.

17 Claims, 20 Drawing Sheets

FEEDFORWARD AMPLIFIER

BACKGROUND OF THE INVENTION

The present invention relates generally to a feedforward amplifier for use mainly in the high-frequency band and, more particularly, to a feedforward amplifier of increased power efficiency.

FIG. 1 illustrates in block form a basic configuration of a feedforward amplifier. The feedforward amplifier comprises a distortion detector 13 made up of an amplifying transfer path 11 of a main amplifier (hereinafter referred to as a main amplifier path) and a first linear signal transfer path (hereinafter referred to as a first linear path) 12 and a distortion canceller or suppressor 16 made up of a second linear signal transfer path (hereinafter referred to as a second linear path) 14 and a distortion injection path 15. The main amplifier path 11 is formed by a series connection of a variable attenuator 21, a variable phase shifter 22 and a main amplifier 23. The first linear path 12 is formed by a series connection of a delay line 24 and a phase inverter 25. The second linear path 12 is formed by a delay line 26. The distortion injection path 15 is formed by a series connection of a variable attenuator 27, a variable phase shifter 28 and a auxiliary amplifier 29. The input into the feedforward amplifier is divided by a power divider 31 to the main amplifier path 11 containing the main amplifier 23 and the first linear path 12. A power combiner/divider 32 generates the sum of and the difference between signals from the main amplifier path 11 and the first linear path 12, and provides them to the second linear path 14 and the distortion injection path 15, respectively. The output from the feedforward amplifier is produced by a power combiner 33 which combines outputs from the second linear path 14 and the distortion injection path 15.

Accordingly, the feedforward amplifier detects a distortion component (a difference component) generated by the main amplifier 23 in the distortion detector 15 and, in the distortion canceller 16, regulates the phase and amplitude of the distortion component and injects it into the output signal from the main amplifier 23 provided via the second linear path 14, thereby canceling nonlinear distortion generated by the main amplifier 23. In general, the amount of nonlinear distortion cancelled by the feedforward amplifier depends on the regulation of the variable attenuator 21 and the variable phase shifter 22 of the distortion detector 13 and the variable attenuator 27, the variable phase shifter 28 and the auxiliary amplifier 29 of the distortion canceller 16. The accuracy of such regulation is disclosed in Japanese Patent Laid-Open Gazette No. 1-198809 entitled "Automatic Regulation Circuit for Feedforward Amplifier." For example, phase and amplitude deviations for achieving a distortion compression of 30 dB or more are ±2° and ±0.3 dB, respectively. It can be said, therefore, that strict conditions are imposed on the balance and completeness of regulation of the transmission characteristics of the distortion detector 13 and the distortion canceller 16.

The feedforward amplifier compensates for the nonlinear distortion generated by the main amplifier 23. Accordingly, because of its circuit configuration the feedforward amplifier cannot theoretically compensate for nonlinear distortion by the auxiliary amplifier 29. Furthermore, because of the stringent condition on the balance of each of the above-mentioned two paths, linearity of input vs. output power performance is required of the auxiliary amplifier 29 of the conventional feedforward amplifier. To increase the linearity of the amplification circuit using a semiconductor amplifying device, it is customary in the prior art to use a Class A bias for the condition of operation to thereby make the saturation output voltage sufficiently larger than the peak voltage of the signal to be amplified.

In recent years there has been a growing demand for small, light and inexpensive radio equipment of lower-power consumption. The same is true of radio equipment using the feedforward amplifier. To reduce the power consumption of the feedforward amplifier, it is essential to increase the power efficiency of both of the main and auxiliary amplifiers. With the increased power efficiency of the both amplifiers, it is possible to reduce their cooling bodies and so on and hence achieve downsizing of radio equipment.

The power efficiency of the main amplifier can be enhanced as by a push-pull circuit which operates under Class B bias condition. The conventional feedforward amplifier is capable of compensating for the nonlinear distortion that occurs in the main amplifier. On the other hand, to increase the power efficiency of the auxiliary amplifier 29 inserted in the distortion injection path 15 of the feedforward amplifier, it is necessary, in general, that the semiconductor amplifying device forming the auxiliary amplifier be caused to operate under a Class B or C bias condition. The nonlinear distortion that results from such bias condition cannot theoretically be compensated for by the feedforward amplifier as referred to above. For these reasons, enhancement of the power efficiency of the auxiliary amplifier 29 gives rise to the problem of impairing the distortion compensating ability of the feedforward amplifier.

The power-supply efficiency of the feedforward amplifier can be expressed by the ratio between the output power of the feedforward amplifier and the power supplied thereto. For example, according to Toshio Nojima and Shouichi Narahashi, "Ultra-Low, Multi-Frequency Common Amplifier for Mobile Communications, —Self-Adjusting Feedforward Amplifier (SAFF-A)" Technical Report of Institute of Electronics, Information and Communication Engineers of Japan, RCS90-4, 1989, in the case where the saturation output power of the main amplifier is 100 W, the saturation output power of the auxiliary amplifier is ⅛ that of the main amplifier, GaAs-MESFETs are used as semiconductor amplifying devices for the main amplifier and the auxiliary amplifier, the drain voltage and current of the MESFET of the main amplifier are 12 V and 20 A, the drain voltage and current of the MESFET of the auxiliary amplifier are 12 V and 5 A and the both amplifiers are operated in a 1.5 GHz band under the Class A bias condition, the power supply to the feedforward amplifier is 300 W. If mean output power back off is set at 8 dB and the loss of the main amplifier output signal in the distortion canceller is ignored, then the feedforward amplifier output is approximately 15 W. Accordingly, the power-supply efficiency of the feedforward amplifier is in the range of between 15/300 and about 5%. Even in the case where a highly efficient amplification circuit such as a Class B push pull amplifier is used as the main amplifier and a Class A amplifier as the auxiliary amplifier, the power-supply efficiency is around 10% or less at the highest.

To achieve high power efficiency of a high-output power amplifier, there is described in W. H. Doherty, "A new high efficiency power amplifier for modulated waves," Pro. IRE, Vol. 24, No. 9, pp.1163–1182, September 1936 a method which employs a plurality of amplifiers of different saturated output voltages. This method is generally known under the name of Doherty method, which has been implemented, for example, in a medium-wave transmitting power amplifier for broadcasting stations. In the Doherty method, a saturation amplifier and a linear amplifier are connected in parallel. The saturation amplifier amplifies signals of mean power or thereabout and the linear amplifier amplifies signals of peak power. The Doherty method achieves high power efficiency amplification by means of the saturation amplifier, but because of the circuit configuration used, signals that ought to be input into the linear amplifier are also applied to the saturation amplifier—this raises the problem of nonlinear distortion. Moreover, the circuit configuration by this method is incapable of compensating for the nonlinear distortion caused by the saturation amplifier.

One method that has been proposed to further increase the powersupply efficiency of the feedforward amplifier is to set the output backoff (a difference between the saturated output power and the output power at the operating point) of the main amplifier at a small value. As is well-known in the art, however, the nonlinear distortion that can be compensated for by the feedforward amplifier is limited only to incompleteness of the linear region of the input/output power characteristic of the main amplifier. That is, in general, the feedforward amplifier cannot compensate for nonlinear distortion as by clipping in the saturation region of the input characteristic.

SUMMARY OF THE INVENTION

It is therefore an object of the present invention to provide a high power-supply efficiency feedforward amplifier that permits amplification with higher power-supply efficiency than the conventional feedforward amplifier while at the same time possessing a distortion compensating capability equal to or more than that of the latter.

According to a first aspect of the present invention, the distortion injection path is configured like the feedforward amplifier. In concrete terms, the auxiliary amplifier is regarded as the main amplifier, and the distortion detection circuit and the distortion injection circuit for the auxiliary amplifier are used to form the distortion injection path. With this configuration, nonlinear distortion by the auxiliary amplifier is compensated for by the feedforward configuration of the distortion injection path and the auxiliary amplifier is allowed to perform high power efficiency operation under a Class B, C, D, E, or F bias condition other than the Class A bias condition.

According to a second aspect of the present invention, the main amplifier of the feedforward amplifier is formed by a plurality of auxiliary amplifiers different amplification characteristics, and the amplification characteristic of the main amplifier is virtually changed according to the level of the input signal to thereby achieve high power efficiency amplification.

The feedforward configuration of the distortion injection path, which is a combination of the first and second aspects of the present invention, increases the power efficiency of the auxiliary amplifier required to have sufficient linearity of input vs. output power performance, and hence enhances the overall power-supply efficiency of the feedforward amplifier. In this instance, by forming the auxiliary amplifier for the distortion detector by a parallel connection of amplifiers of different saturated output powers, the efficiency of the power-supply efficiency of the feedforward amplifier is similarly increased.

DETAILED DESCRIPTION OF THE PREFERRED EMBODIMENTS

FIRST EMBODIMENT

Figure 2:
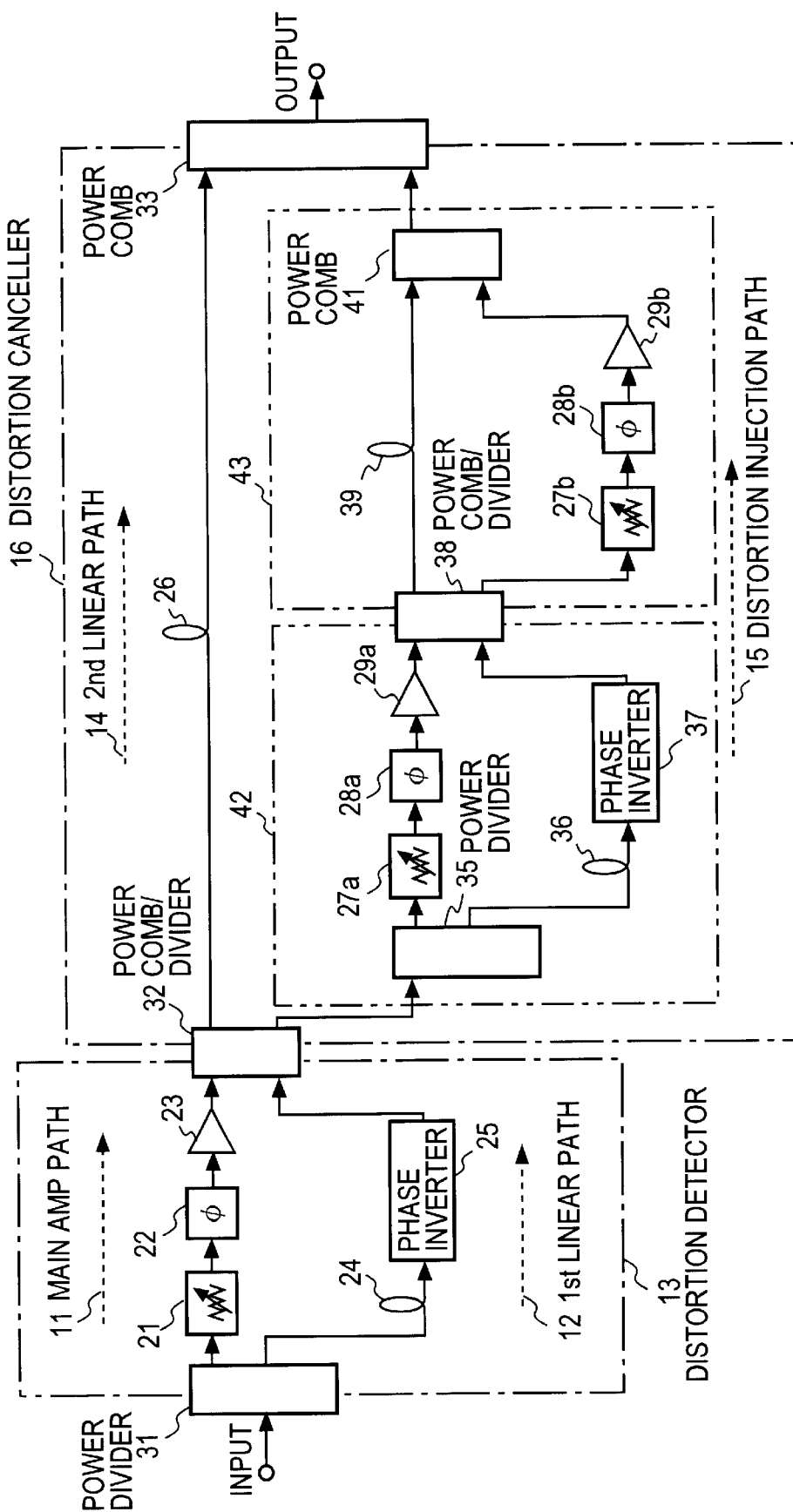
FIG. 2 is a block diagram illustrating an embodiment according to a first aspect of the present invention.

FIG. 2 illustrates in block form a first embodiment of the present invention, in which the auxiliary amplifier 29 of the distortion injection path in the conventional feedfroward amplifier is feedforward-configured. The feedforward-configured auxiliary amplifier will hereinafter be referred to as an auxiliary feedforward amplifier. The distortion injection path 15 comprises: a power divider 35 that receives the output from the distortion detection detector 13; a path formed by a series connection of a variable attenuator 27a, a variable phase shifter 28a and a first auxiliary amplifier 29a which is supplied with the one of two outputs from the power divider 35; a path formed by a series connection of a delay line 36 and a phased inverter 37 which is supplied with the other output from the power divider 35; a power combiner/divider 38; a path formed by a delay line 39 which is supplied with the sum output from the power combiner/divider 38; a path formed by a series connection of a variable attenuator 27b, a variable phase shifter 28b and a second auxiliary amplifier 29b which is supplied with the difference output from the power combiner/divider 38; and a power combiner 41 for combining the outputs from these two paths.

With the feedforward configuration of the auxiliary amplifier 29 of the distortion injection path 15, a semiconductor amplifying device of the first auxiliary amplifier 29a is caused to operate with high power efficiency under a condition other than the Class A bias condition; a distortion component newly caused by the high power efficiency operation of the auxiliary amplifier 29a is detected by an auxiliary distortion detector 42 made up of the variable attenuator 27a, the variable phase shifter 28a, the first auxiliary amplifier 29a, the delay line 36 and the phase inverter 37, and the thus detected distortion component is used to cancel the distortion component by the first auxiliary amplifier 29a in an auxiliary distortion canceller 43 made up of the variable attenuator 27a, the variable phase shifter 28b, the second auxiliary amplifier 29b and the delay line 39. Thus, high power efficiency amplification by the first auxiliary amplifier 29a can be achieved.

With feedforward configuration of the auxiliary amplifier, the distortion injection path in the FIG. 2 embodiment is formed by the distortion detector (hereinafter referred to as an auxiliary distortion detector) 42 containing the first auxiliary amplifier 29a and the distortion canceller (hereinafter referred to as an auxiliary distortion canceller) 43 containing the second auxiliary amplifier 29b. This auxiliary feedforward amplifier (42+43) operates on exactly the same principle as that of the traditional feedforward amplifier. That is, the distortion component by the main amplifier 23 is fed into the auxiliary feedforwrd amplifier (42+43), wherein the distortion component newly produced by the first auxiliary amplifier 29a is detected by the auxiliary distortion detector 42 of the distortion injection path 15 and the new distortion component is cancelled by the auxiliary distortion canceller 43 of the distortion injection path 15 without exerting any influence on the distorted component from the main amplifier 23. The Doherty method has a defect that nonlinear distortion is produced in an amplifier of low saturated output, but in this embodiment the out-of-band distortion component, which is caused by a decrease in the output backoff, can sufficiently be suppressed by the distortion detector and the distortion canceller of the feedforward amplifier.

A description will be given of a first concrete example which employs a Class B push-pull circuit as the first auxiliary amplifier 29a. A Class B push-pull amplifier is used as the first auxiliary amplifier 29a and a Class A amplifier as the second auxiliary amplifier 29b. The power-supply efficiency of the feedforward amplifier is the ratio of its output power to the power supplied thereto. Since the first concrete example uses the main amplifier 23, the first auxiliary amplifier 29a and the second auxiliary amplifier 29b, the power-supply efficiency is the ratio of their output power to supplied power. A brief description will be made below of the effect of this concrete example which will be obtained under the same conditions used in the aforementioned Nojima et al. literature.

In the case where the saturated output of the main amplifier 100W and the saturated output of the first auxiliary amplifier 29a is $\frac{1}{8}$ of the saturated output of the former, it is considered that the saturated output of the second auxiliary amplifier 29b is also $\frac{1}{8}$ of that of the first auxiliary amplifier 29a and hence is $\frac{1}{64}$ of the saturated output of the main amplifier 23. In the case where the main amplifier 23 is formed by a Class B push-pull amplifier of a 12-V drain voltage and a 10-A drain current and the drain voltage and current of the first auxiliary amplifier 29a are 10 V and 3 A or so, respectively, if the drain voltage of the second auxiliary amplifier 29b is set at 10 V, its drain current is estimated to be approximately 0.3 A. Consequently, it is estimated that the power supplied to the feedforward amplifier in the first concrete example is around 153 W, which is about one half that obtainable in the prior art, and that the power-supply efficiency is 10% or so, that is, twice higher than in the prior art. Thus, the overall power-supply efficiency of the feedforward amplifier can be improved by the high efficiency amplification through the use of the Class B push-pull amplifier as the first auxiliary amplifier 29a.

In a second concrete example that uses a Class F amplifier as the first auxiliary amplifier 29a, the main amplifier 23 is formed by a Class B push-pull amplifier and the power conversion efficiency of the feedforward amplifier is estimated as in the first concrete example. In the case where the drain voltage and current of the main amplifier 23 are 12 V and 10 A, respectively, and the drain voltage and current of the first auxiliary amplifier 29a are 10 V and 2 A or so, respectively, if the drain voltage of the second auxiliary amplifier 29b is 10 V, its drain current is estimated to be approximately 0.3 A. Accordingly, it is estimated that the power supplied to the feedforward amplifier in the second concrete example is approximately 143 W, which is less than in the first concrete example, and that the powersupply efficiency increases to 12% or so. Thus, the overall power-supply efficiency of the feedforward amplifier can be improved by the high power efficiency amplification through the use of the Class A amplifier as the first auxiliary amplifier 29a.

In a third concrete example that uses a Class C amplifier as the first auxiliary amplifier 29a, the main amplifier 23 is formed by a Class B push-pull amplifier and the power-supply efficiency of the feedforward amplifier is estimated as in the first concrete example. In the case where the drain voltage and current of the main amplifier 23 are 12 V and 10 A, respectively, and the drain voltage and current of the first auxiliary amplifier 29a are 10 V and 2 A or so, respectively, if the drain voltage of the second auxiliary amplifier 29b is 10 V, its drain current is estimated to be approximately 0.3 A. Accordingly, it is estimated that the power supplied to the feedforward amplifier in the second concrete example is approximately 143 W, which is one half that obtainable in the prior art, and that the power-supply efficiency increases to about 12% which is twice higher than in the past. Thus, the overall power-supply efficiency of the feedforward amplifier can be improved by the high power efficiency amplification through the use of the Class A amplifier as the first auxiliary amplifier 29a.

SECOND EMBODIMENT

Figure 3:
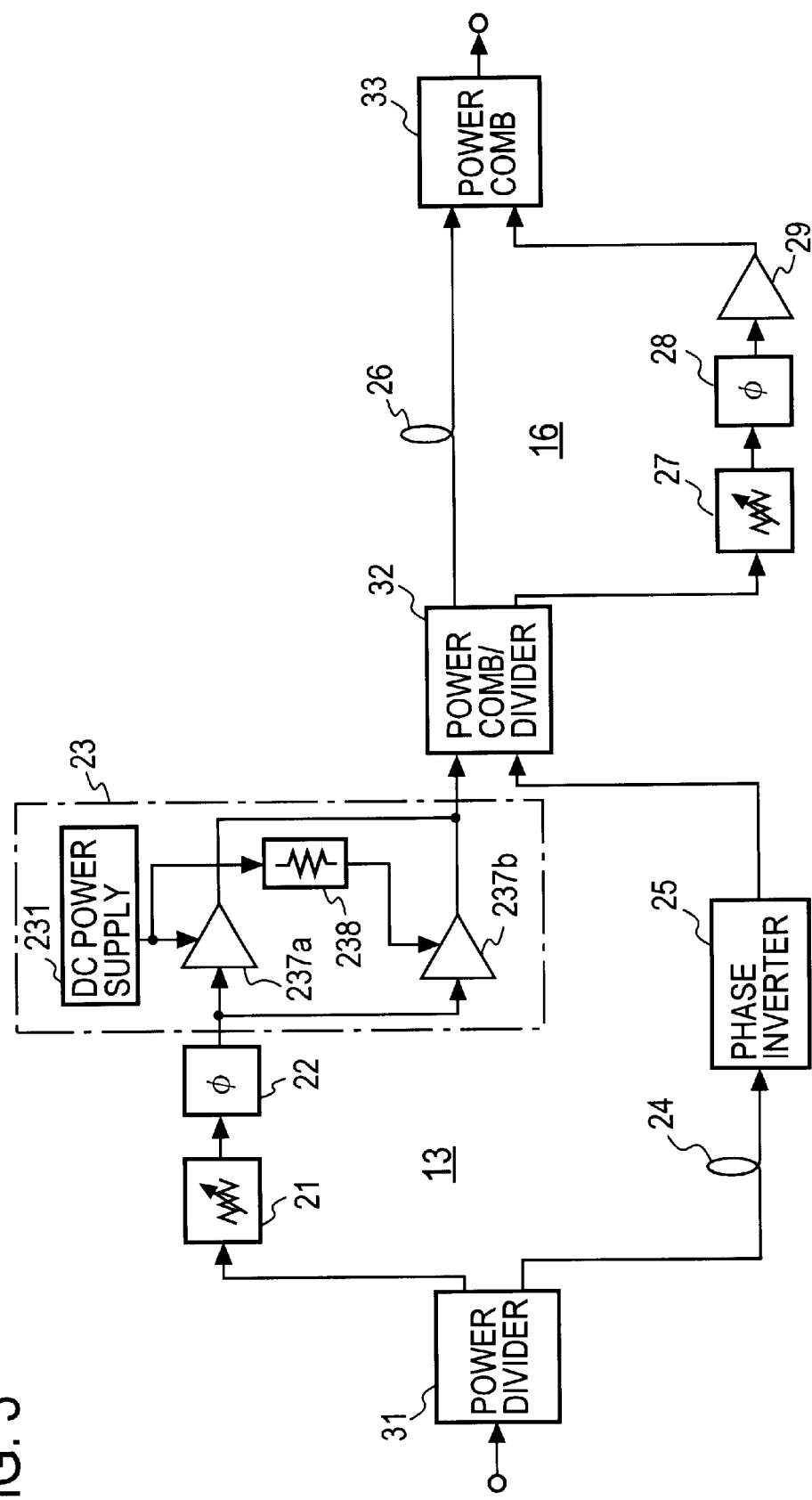
FIG. 3 is a block diagram illustrating an embodiment according to a second aspect of the present invention.

FIG. 3 illustrates in block form a second embodiment of the present invention. This embodiment utilizes, for the main amplifier 23, a parallel connection of plural amplifiers of different saturation output powers by the Doherty method to achieve higher power-supply efficiency than in the case of forming the main amplifier 23 by a single amplifier. That is, in this embodiment the main amplifier 23 is formed by a parallel connection of two amplifiers 237a and 237b of different amplification characteristics. The amplifiers 237a and 237b are each supplied with different power. Concretely, the amplifier 237a is supplied power directly from a DC power source 231, whereas the amplifier 237b is supplied with power via a resistance device 238 through which it is made lower than the voltage supplied to the amplifier 237a. As a result, the amplifier 237a is set with an amplification characteristic of higher saturation voltage than that of the amplifier 237b. Assume that the amplifier circuits 237a and 237b are formed by semiconductor amplifying devices of the same type. In practice, however, different types of semiconductor amplifying devices can be used.

Figure 4A:
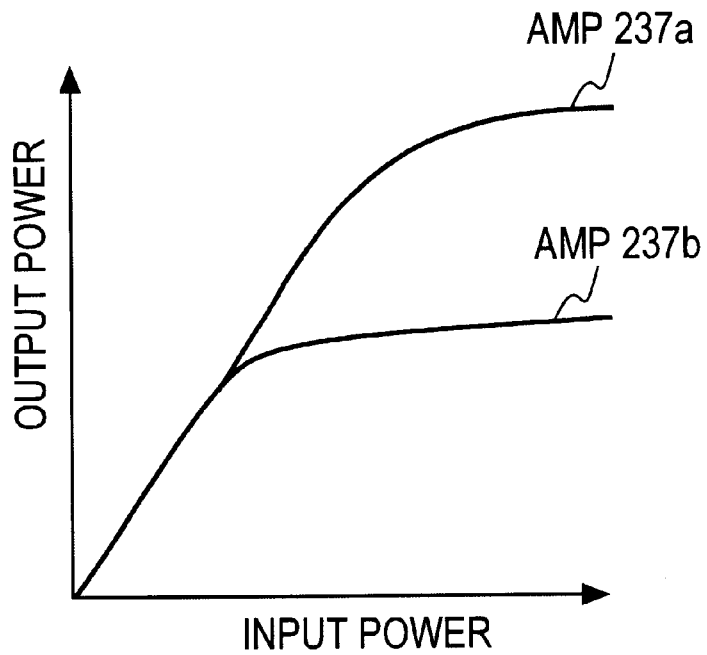
FIG. 4A is a graph showing input vs. output power characteristics of amplifiers 237a and 237b.

FIG. 4A shows the relationships between the input-output power characteristics of the amplifiers 237a and 237b supplied with different voltages as mentioned above. As depicted in FIG. 4A, the saturation output power of the amplifier 237a is higher than that of the amplifier 237b. The type of power amplification by the amplifier 237a or 237b differs with the magnitude of the input power to the main amplifier 23. As is the case with the Doherty method, for example, the amplifier 237b amplifies signals of the frequency of mean power or thereabout and the amplifier 237a amplifies signals sufficiently higher in frequency than the mean power. Though dependent on the frequency of generation of the signals that are amplified by the amplifier 237a, the operating time of the amplifier 237a becomes shorter than in the case of setting a sufficiently large output backoff as in the prior art. This means that the power-supply efficiency of the amplifier can be increased in accordance with the frequency distribution of amplitudes of input signals to the main amplifier.

Figure 4B:
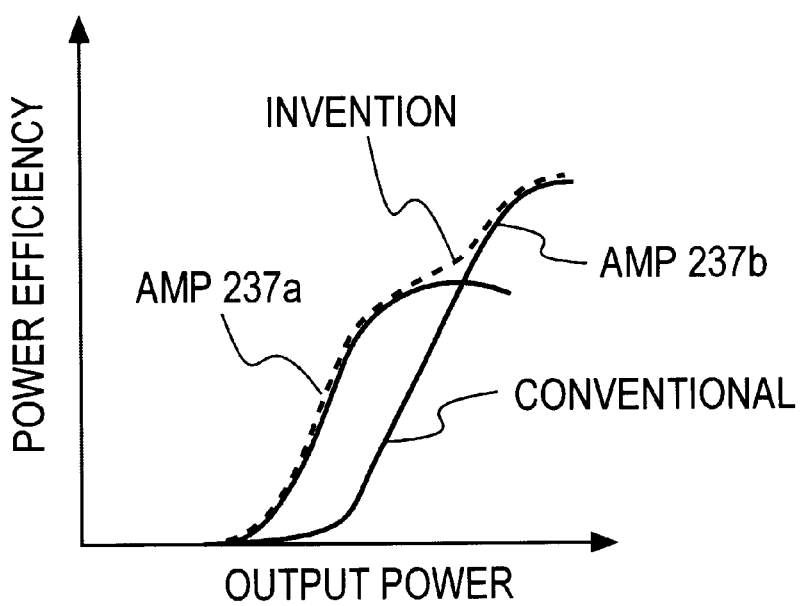
FIG. 4B is a power-supply efficiency-output power characteristic diagram.

FIG. 4B depicts power-supply efficiency vs. output power characteristics of the both amplifiers. It can be said that the power-supply efficiency of the feedforward amplifier according to the present invention is higher than in the case of the conventional method utilizing the output backoff. The power-supply efficiency of the main amplifier can be further enhanced by suspending the voltage application to the amplifier 237a in case of low peak power.

Since no sufficient output backoff is set in the amplifier 237b, however, there arises a problem that out-of-band distortion power increases; but the feedforward configuration permits suppression of distortion that occurs in the amplifier 237b. Accordingly, it is possible to provide the same distortion compensating ability as is obtainable with the prior art while achieving higher power efficiency than in the case of designing the main amplifier by the conventional output backoff scheme.

As described above, according to the second embodiment of the invention, the main amplifier of the feedforward amplifier is formed by a parallel connection of amplifiers of different saturation output power characteristics. The saturation output powre depends on gate, base, drain and collector voltages of the semiconductor amplifying device which forms the amplifier. With the amplifier of different saturation outputs connected in parallel, it is possible to select the amplifier of the saturation output corresponding to the peak to average power ratio of the input signal of the amplifier.

Figure 5:
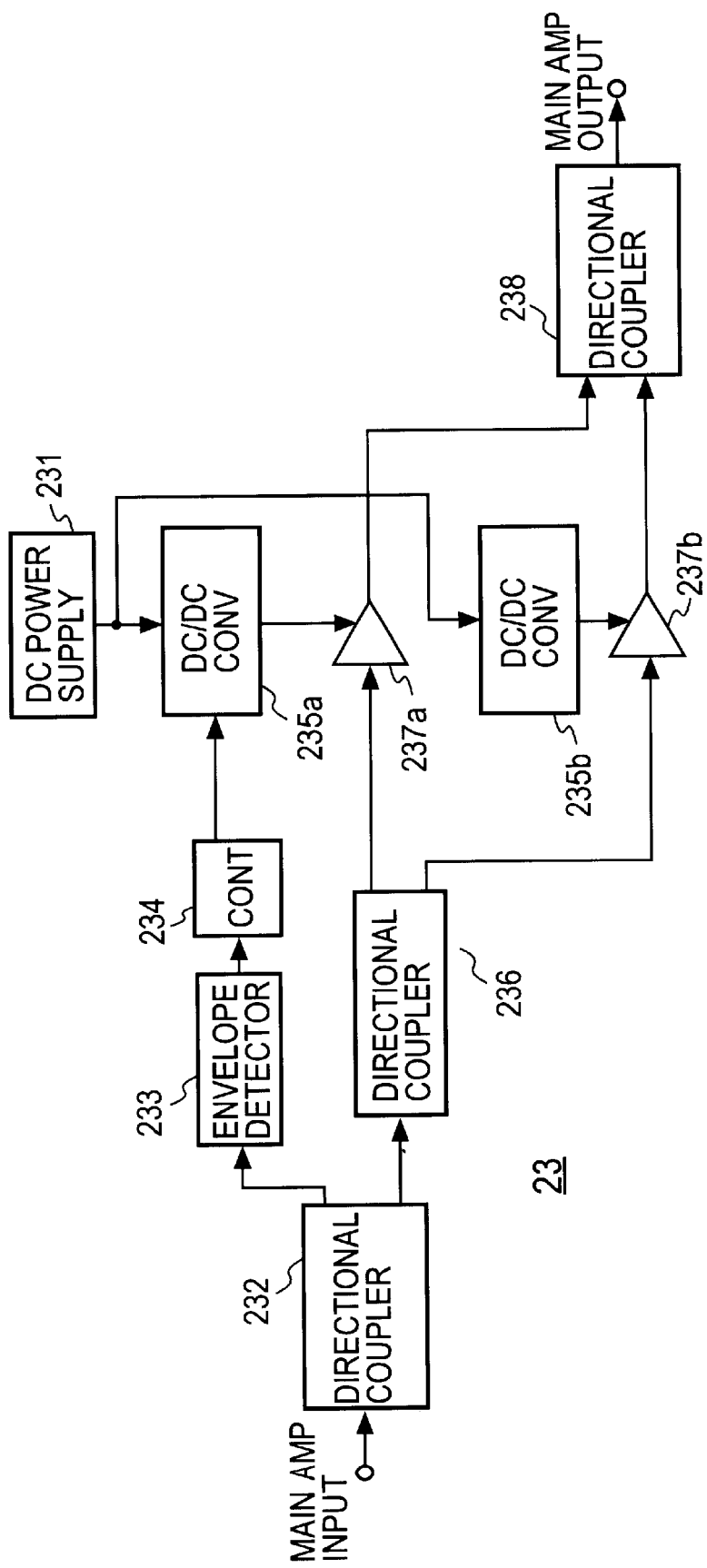
FIG. 5 is a block diagram depicted a concrete example of a main amplifier 23 in FIG. 2.

FIG. 5 depicts in block form a modified form of the main amplifier 23 in the second embodiment shown in FIG. 3. The input signal to the main amplifier 23 is branched by a directional coupler 232, then the envelope of the branched main amplifier input signal is detected by an envelope detector 233, and output voltages of DC—DC converters 235a and 235b are controlled by a control circuit 234 in accordance with the level of the detected envelope. That is, the output voltage from a DC power supply 231 is applied via the DC—DC converters 235a and 235b to the amplifiers 237a and 37b. The output voltage of the DC—DC converter 235b is set lower than the output voltage of the DC—DC converter 235a. The other output signal from the directional coupler 232 is branched by a directional coupler 236 to the inputs of the amplifiers 237a and 237b, whose outputs are combined by a directional coupler 238 to provide the output from the main amplifier 23. As compared with the FIG. 3 embodiment, the illustrated modification provides the advantage of more effectively preventing the occurrence of the out-of-band distortion component and achieving higher power efficiency amplification of the main amplifier 23 and hence permitting control of its output power.

Figure 6:
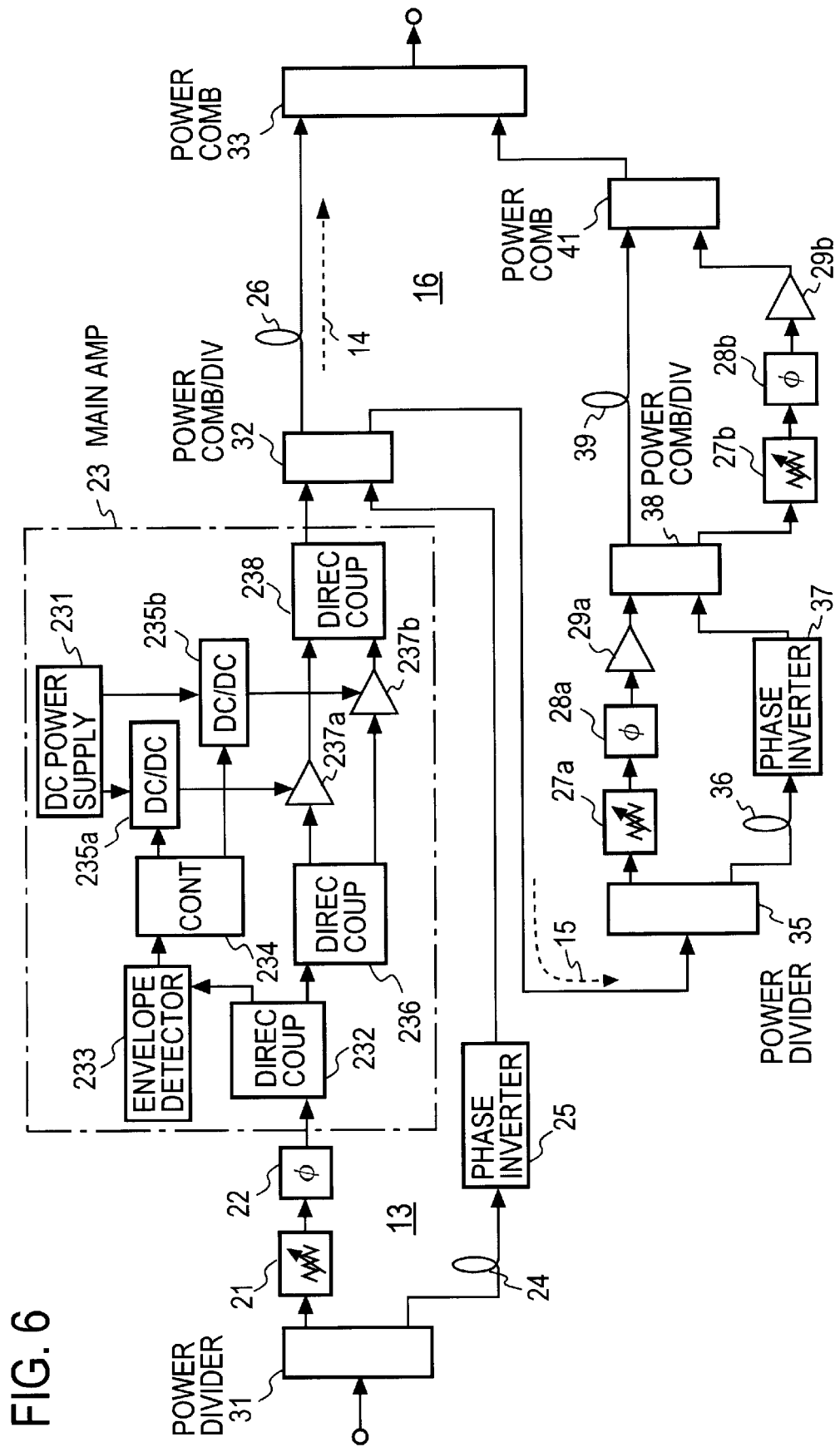
FIG. 6 is a block diagram illustrating an embodiment in accordance with a combination of the first and second aspects of the present invention.

FIG. 6 depicts in block form an embodiment in which the modified amplifier configuration of FIG. 5 is applied to the main amplifier 23 in the first embodiment of FIG. 2. That is, in this embodiment the main amplifier has the FIG. 5 configuration and the distortion injection path has the feedforward structure depicted in FIG. 2. The configuration of FIG. 6 allows compensation of distortion by the first auxiliary amplifier 29a, making it possible to apply thereto operating conditions for high power efficiency amplification, such as a Class B operation. Since the power efficiency of the auxiliary amplifier can thus be improved, the power efficiency of the feedforward amplifier can be further increased.

Figure 7:
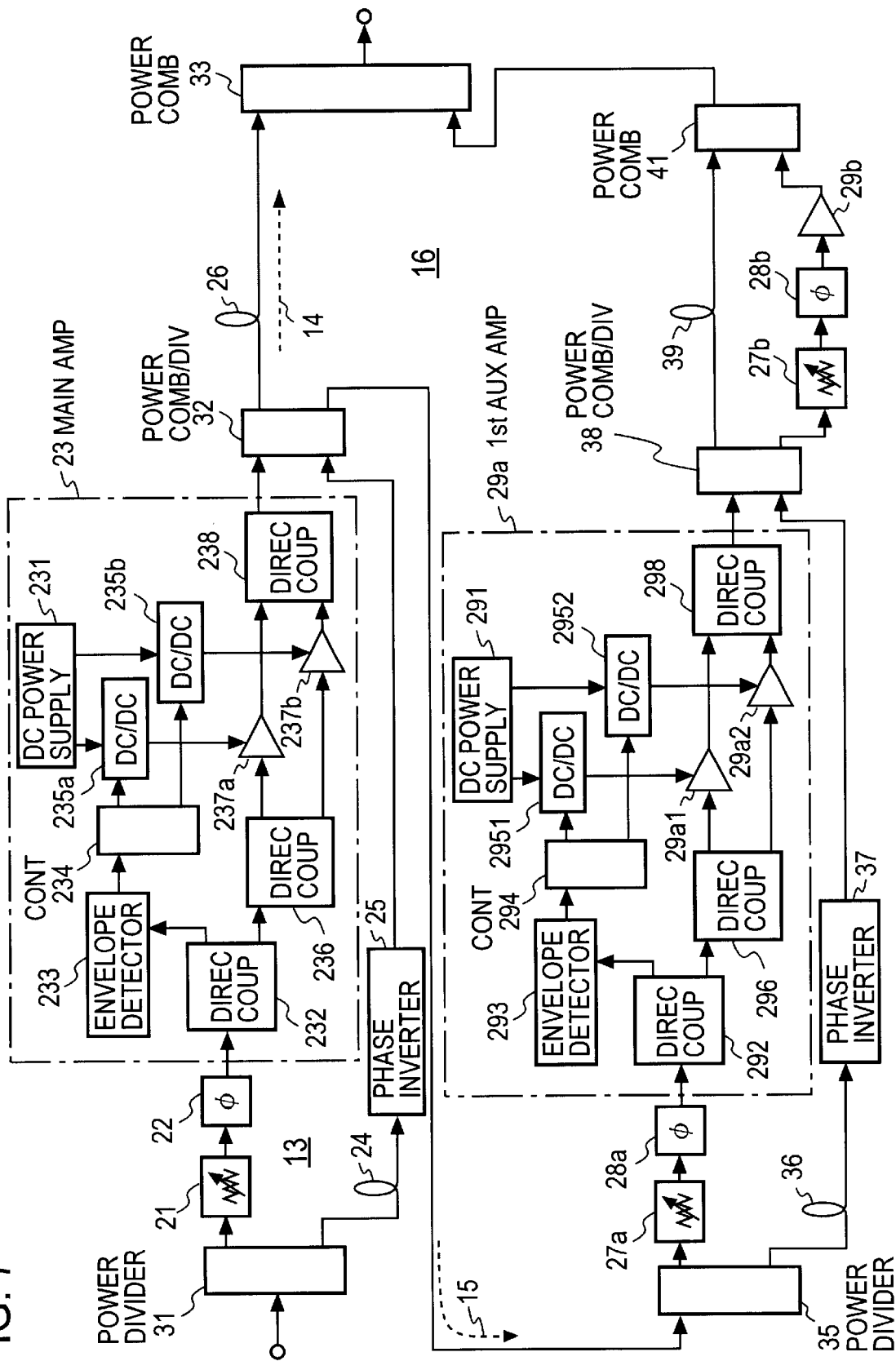
FIG. 7 is a block diagram depicting a modified form of the FIG. 5 embodiment.

FIG. 7 illustrates in block form still another embodiment according to the second aspect of the present invention. The embodiment applies the amplifier configuration of FIG. 5 to the first auxiliary amplifier 29a of the feedforward-configured distortion injection path in the FIG. 6 embodiment. That is, the first auxiliary amplifier 29a is formed by a parallel connection of amplifiers 29a 1 and 29a 2, and the output voltage from a DC power supply 291 is applied to DC—DC converters 2951 and 2952, from which different voltages are applied to the amplifiers 29a 1 and 29a 2. The input signal into the first auxiliary amplifier 29a is envelope-detected by an envelope detector 93, and the output voltages of the DC—DC converters 2951 and 2951 are controlled by a controller 294 in accordance with the detected envelope level. This circuit configuration improves the power-supply efficiency of the first auxiliary amplifier 29a as well as the power supply efficiency the main amplifier 23, providing increased power-supply efficiency of the feedforward amplifier.

While in the above the main amplifier 23 and the auxiliary amplifier 29a have each been described to be formed by to amplifiers, it will easily be understood from the above that the use of three or more amplifiers for each of them will also improve the power-supply efficiency of the feedforward amplifier.

THIRD EMBODIMENT

Figure 8:
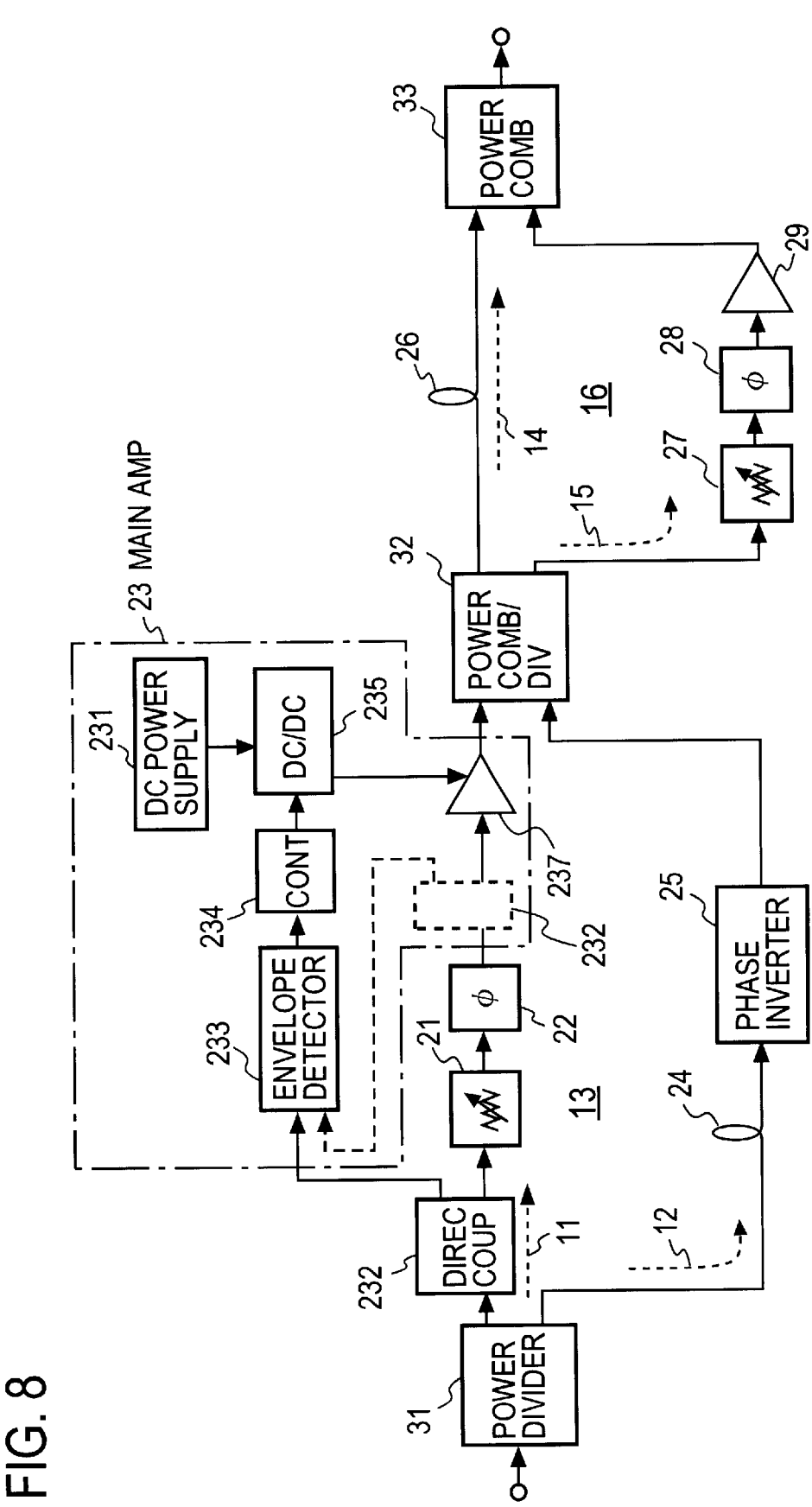
FIG. 8 is a block diagram illustrating an embodiment according to a third aspect of the present invention.

FIG. 8 illustrates in block form an embodiment according to the third aspect of the present invention. In the embodiments of FIGS. 3, 5, 6 and 7 the main amplifier 23 is composed of the two amplifiers 237a and 237b, different amplification characteristics (different saturation output powers) are set for them, and these amplification characteristics (saturation output powers) are controlled using the envelope of the input signal level. In the FIG. 8 embodiment the saturation voltage of one semiconductor amplifying device 237, which forms the main amplifier 23 of the feedforward amplifier is controlled using the envelope of the input signal level. The input signal provided by the power divider 31 to the main amplifier transfer path 11 is applied via the directional coupler 232 to the envelope detector 233. The envelope detector 233 in this example is formed by a receiver using a frequency down converter. Alternatively, it may be a detector using a diode for detecting peak power. The output from the envelope detector 233 is fed to the control circuit 234. The control circuit 24 controls the power converter 235. The power converter 235 may be such a dropper as high power conversion efficiency DC—DC converter or transistor. This control channel controls the saturation voltage that is provided to the semiconductor amplifying adjust device forming the main amplifier 23.

Figure 9:
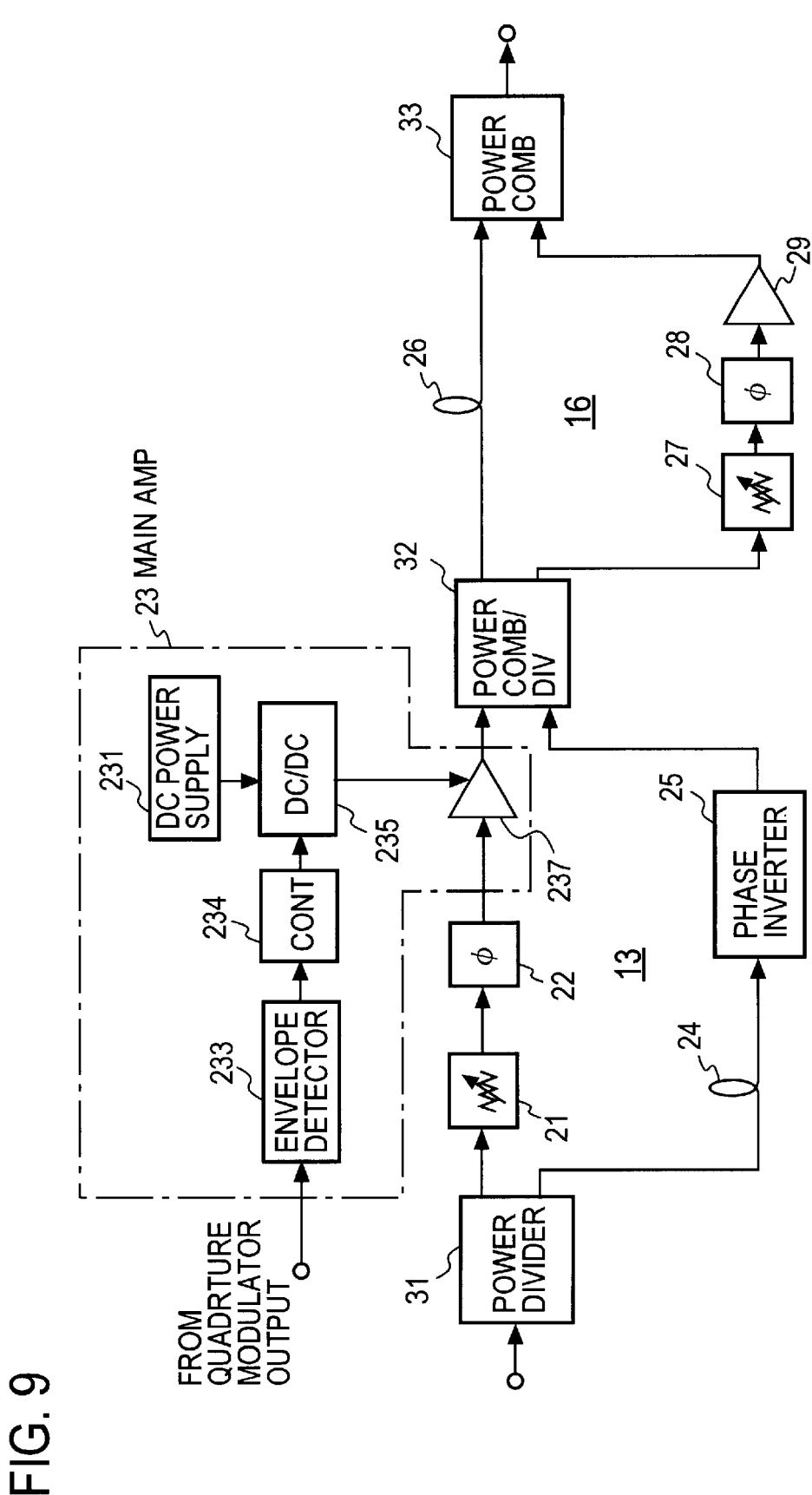
FIG. 9 is a block diagram illustrating another embodiment according to the third aspect of the present invention.

Instead of supplying the envelope detector 233 with the input signal to the variable attenuator 21, the input signal to the main amplifier 23 may be applied to the envelope detector 233 after being divided as indicated by the broken lines in FIG. 8. Alternatively, the output from an quadrature modulator of a low-frequency stage in the production of the input signal for the feedforward amplifier may be divided for input into the envelope detector 233 as depicted in FIG. 9. Accordingly, the FIG. 9 embodiment is exactly identical in construction with the FIG. 8 embodiment except that the former does not use the directional coupler 232.

Controlling the voltage of the semiconductor amplifying device, which forms the main amplifier 23, causes variations in the amplitude and phase of its output signal. Such variations can be dealt with by dynamic control of the variable attenuator 21 and the variable phase shifter 22.

As described above, by applying the first embodiment to the embodiment of FIG. 8(and FIG. 9) to use the feedforward configuration for auxiliary amplifier and for the distortion injection path of the feedforward amplifier, the nonlinear distortion which would otherwise be caused by the auxiliary can be avoided, and the auxiliary amplifier can be operated under a bias condition which provides excellent power-supply efficiency, other than the Class A bias condition. Coupled with the voltage control of the semiconductor amplifying device forming the main amplifier, the use of the feedforward structure ensures increasing the overall power-supply efficiency.

Figure 10:
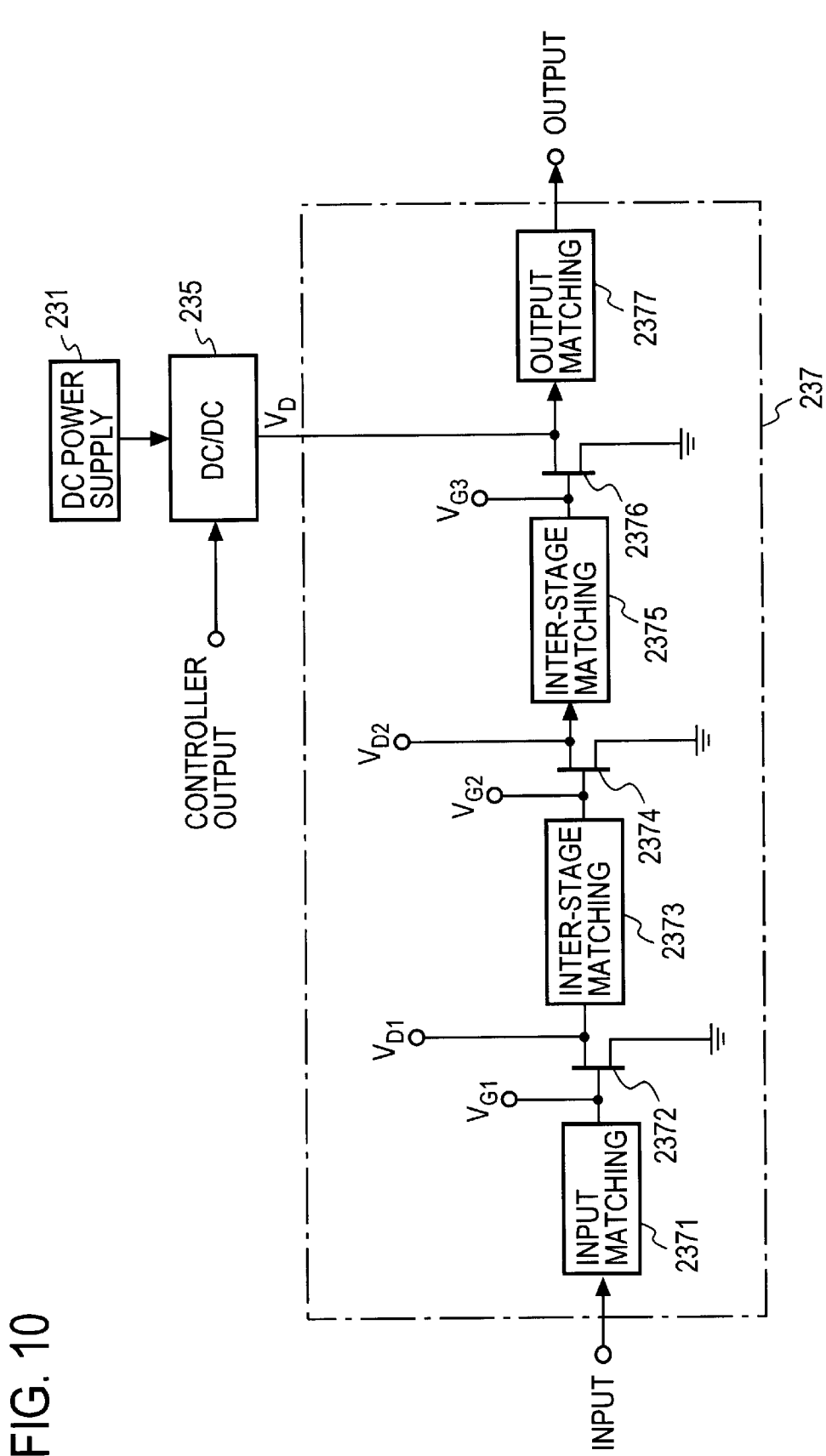
FIG. 10 is a block diagram depicting a concrete example of the main amplifier 23.

Turning next to FIG. 10, drain voltage control of the amplifiers in FIGS. 3, 5, 6 and 7, the amplifiers 237a and 237b in FIG. 7, the amplifiers 29a and 29b in FIG. 7 and the main amplifiers 23 in FIGS. 8 and 9 will be described below in connection with the main amplifier 23. The input to the main amplifier 23 is provided via an input matching circuit 2371 to the gate of a first-stage FET 2372; the drain output from the FET 2372 is fed via an inter-stage matching circuit 2373 to the gate of a second-stage FET 2374; the drain output from the FET 2374 is fed via an inter-stage matching circuit 2375 to the gate of a third-stage FET 2376; and the drain output from the FET 2376 is provided via an output matching circuit 2377 as the output from the main amplifier 23. The drain of the FET 2376 is supplied with the output $V_D$ from a DC—DC converter 235; the drains of the FETs 2372 and 2374 are supplied fixed drain voltages $V_{D1}$ and $V_{D2}$, respectively; and the gates of the FETSs 2372, 2374 and 2376 are supplied with fixed gate voltages $V_{G1}$, $V_{G2}$ and $V_{G3}$, respectively.

Figure 11A:
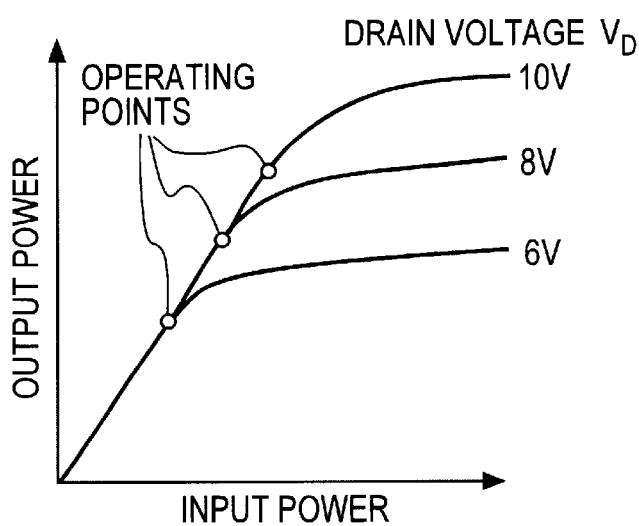
FIG. 11A is a graph showing the output power-input power characteristic of the main amplifier 23.
Figure 11B:
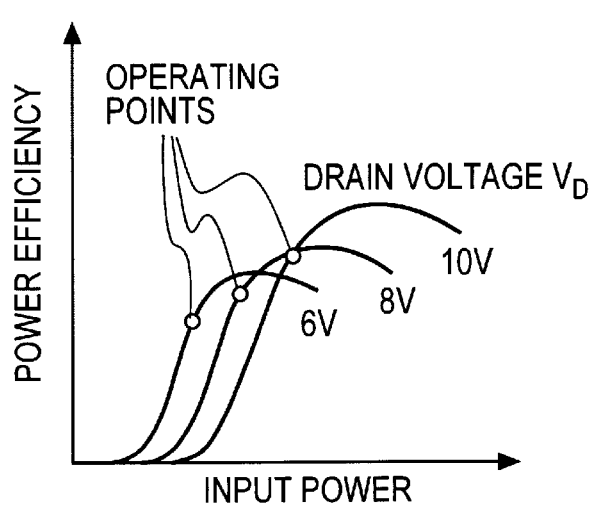
FIG. 11B is a power-supply efficiency-input power characteristic diagram.
Figure 11C:
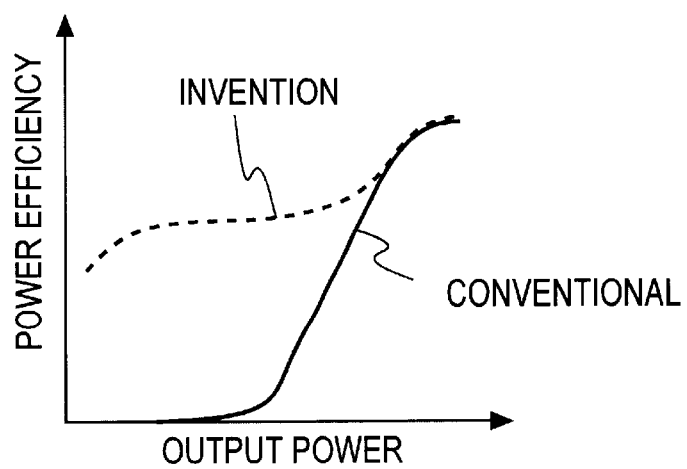
FIG. 11C is power-supply efficiency-output power characteristic diagram.

As described above, the main amplifier 23 is formed by the three stages of FETs 2372, 2374 and 2376 and the drain voltage control is effected on the FET 2376 of the final stage, but. since the amplifier is usually formed multi-stage, the control may be done at any stage. FIG. 11A shows the output power performance of the main amplifier 23. The drain voltage $V_D$ is chosen 6, 8 and 10 V. The operating points in the graph represent the operating points of the FET corresponding to the respective drain voltages. FIG. 11B shows the power efficiency performance in relation of the input powre. The conditions used are the same as in the case of FIG. 11A. As will be understood from FIGS. 11A and 11B, high power efficiency of the main amplifier is achieved by controlling the drain voltage in accordance with the level of the input signal to the main amplifier 23, that is, by decreasing the drain voltage if the input power is small. FIG. 11C shows the power efficiency performance in relation of the output power. With the conventional fixed drain voltage, the power efficiency abruptly decreases with a change in the output power as indicated by the solid line, but according to the present invention, the power efficiency can be raised, irrespective of the output power, to some extent by drain voltage control as indicated by the broken line.

While the above embodiment has been described to use the FETs, the same effects as above mentioned are obtainable with bipolar transistors.

Figure 12:
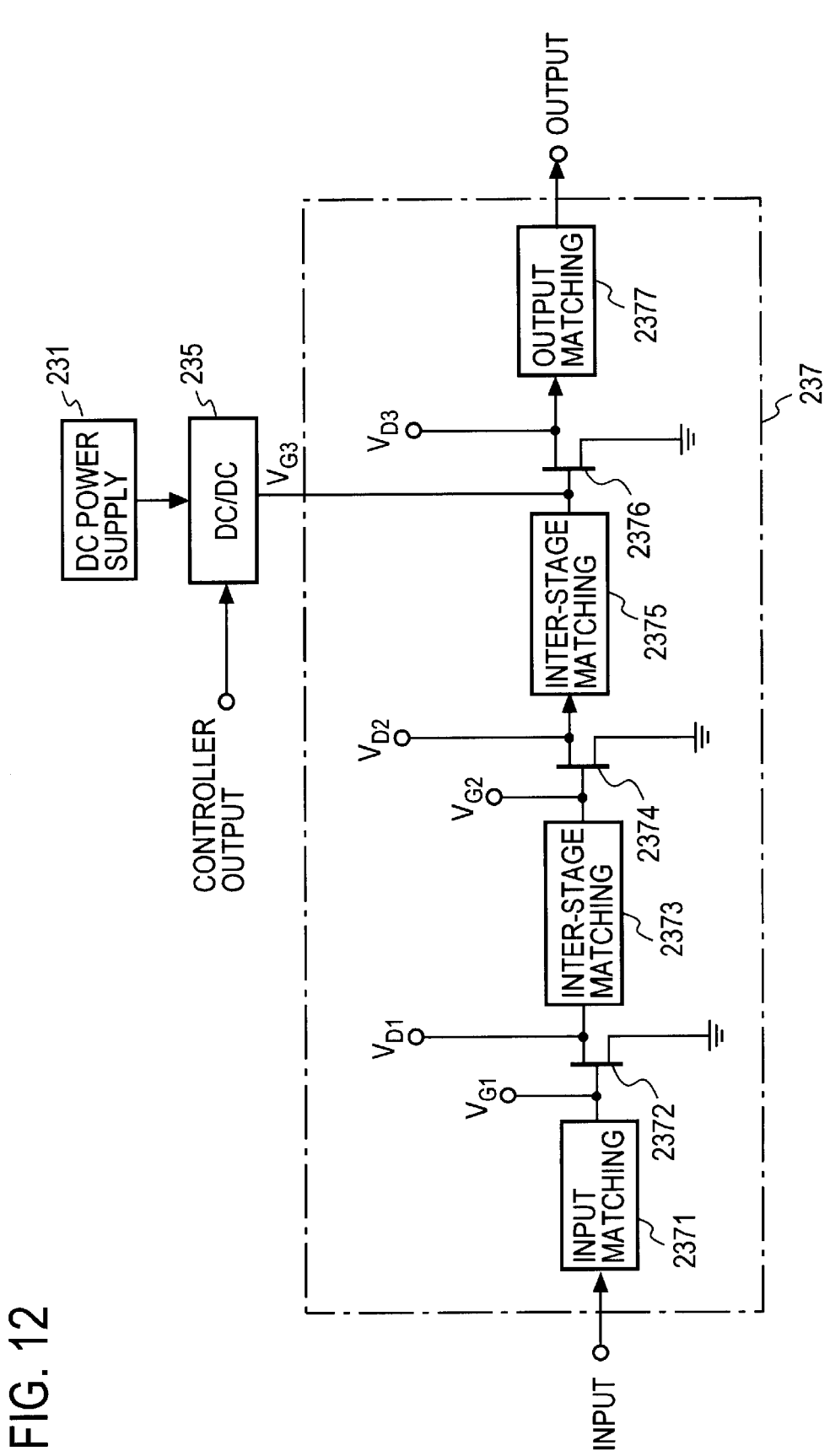
FIG. 12 is a block diagram depicting another concrete example of the main amplifier 23.

An example of the configuration of the main amplifier 23 whose bias voltage is controlled is shown in FIG. 12, in which the parts corresponding to those in FIG. 10 are identified by the same reference numerals. FIG. 12 depicts an example which controls the gate voltage of the FET 2376. The effect of improving the power efficiency by the gate voltage control is virtually the same as in the case of drain voltage control. The gate voltage is controlled in the FET 2376 of the final stage, but it may be effected at the first or intermediate stage. The DC—DC converter 235 for the gate voltage control can be made extremely simple-structured using, for example, a capacitor, because substantially no current flows across the gate terminal. While the above embodiment has been described to use the FETs, the same effects as above mentioned are obtainable with bipolar transistors.

As compared with the drain voltage control, the gate voltage control causes an increase in nonlinear distortion of the main amplifier 23. The increased nonlinear distortion is adjusted using an adaptive algorithm or the like in a manner to cancel it by the variable attenuator 21 and the variable phase shifter 22 in the distortion detector 13.

As depicted in FIGS. 10 and 12, the voltage $V_D$ is applied from the voltage converter to the collector or drain terminal of the common-emitter or common-source semiconductor amplifying device 237 (237a, 237b) in the main amplifier 23 in FIGS. 5 to 9, and this applied voltage is controlled in accordance with the envelope of the input signal to the main amplifier so that the semiconductor amplifying device 237 stays at an operating point of high power-supply efficiency at all times. The nonlinear distortion by this amplifier operation is compensated for by the function of the feedforward amplifier. As a result, the power efficiency of the main amplifier can be improved with no serious increase in distortion.

The same results as mentioned above are also obtainable in the case of applying the voltage $V_D$ from the voltage converter to the base or gate terminal of the emitter- or source-grounded semiconductor amplifying device 237 (237a, 237b) in the main amplifier 23 and controlling the applied voltage according to the envelope of the input signal to the main amplifier 23.

Figure 13:
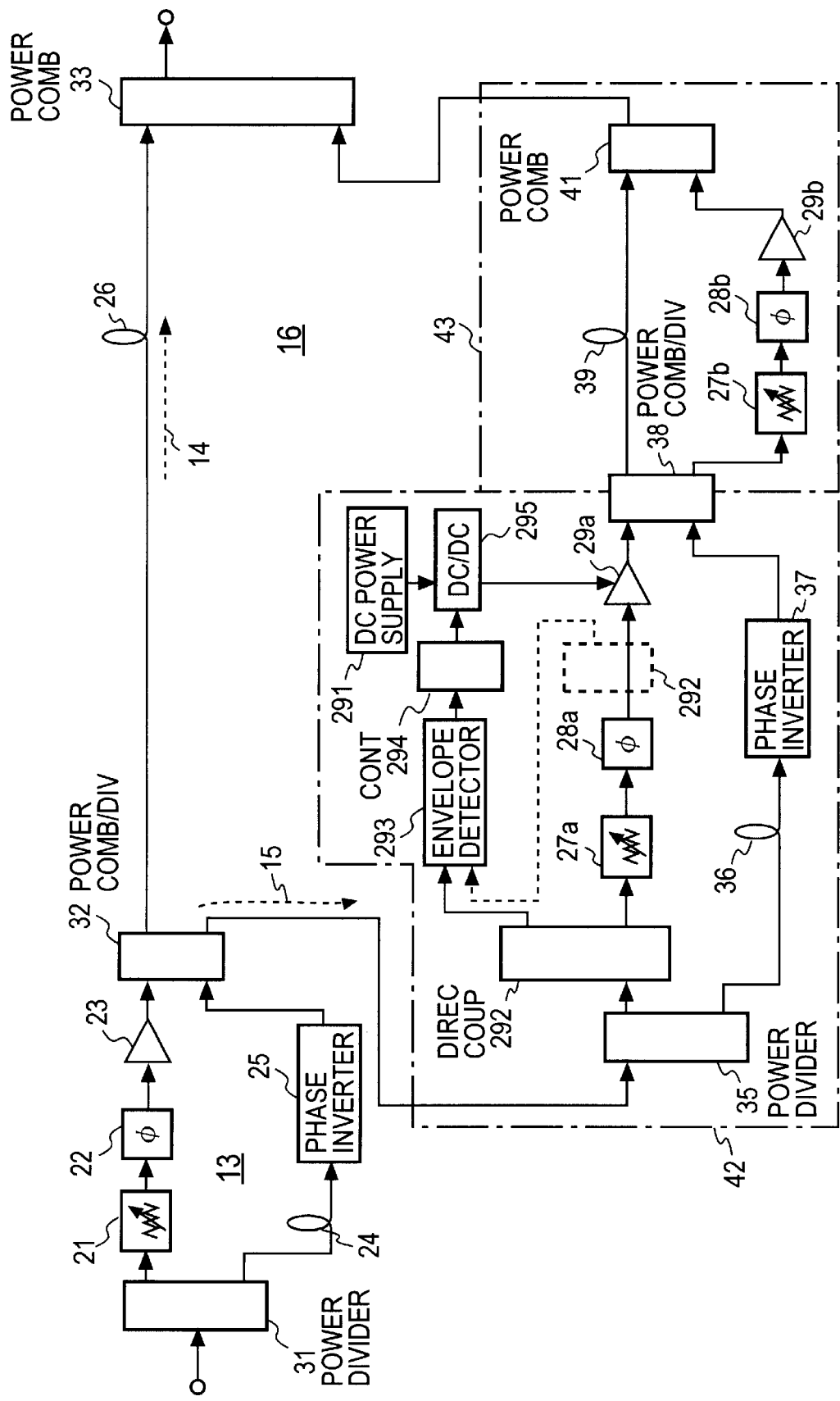
FIG. 13 is a block diagram illustrating an embodiment in accordance with a combination of the first and third aspects of the present invention.

FIG. 13 illustrates in block form an embodiment of a feedforward amplifier in which the first auxiliary amplifier in the first embodiment of FIG. 2 has the same configuration as that of the main amplifier 23 in the third embodiment of FIG. 8. In this embodiment, the first auxiliary amplifier 29

Figure 1:
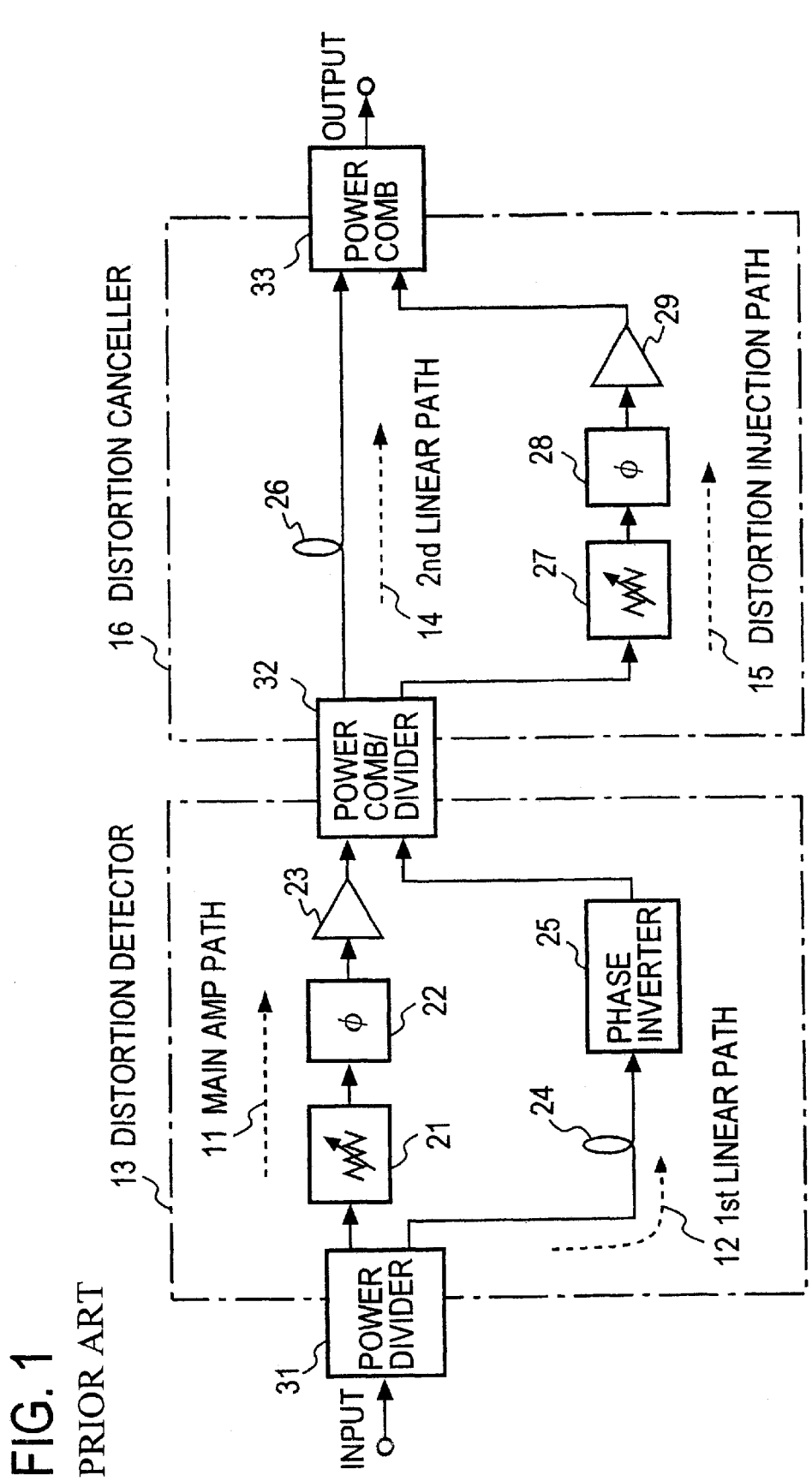
FIG. 1 is a block diagram depicting a conventional feedforward amplifier.

(FIG. 1) of the distortion injection path 15 is feedforward-structured as depicted in FIG. 2 and the voltage is applied via a DC—DC converter 295 to the first auxiliary amplifier 29a forming this auxiliary feedforward amplifier, and the output signal from the power divider 35 is divided by the directional coupler 292 into two; the one output signal is fed to the variable attenuator 27a and the other is envelope-detected by the envelope detector 293, the DC—DC converter 295 being controlled by the control circuit 294 in accordance with the envelope level.

The envelope detector may be a peak power detector formed by a diode ot the like. Based on the detected signal, the control circuit 294 controls the DC—DC converter 295 or a transistor dropper. This controls the voltage to be applied to the semiconductor amplifying device that forms the auxiliary amplifier 29a. As indicated by the broken lines, the input signal to the auxiliary amplifier 29a may be divided immediately prior to the application thereto and fed to the envelope detector 293. Furthermore, the control of the voltage to be applied to the auxiliary amplifier 29a in FIG. 12 can be used for either of the drain voltage control and the gate voltage control.

Figure 14:
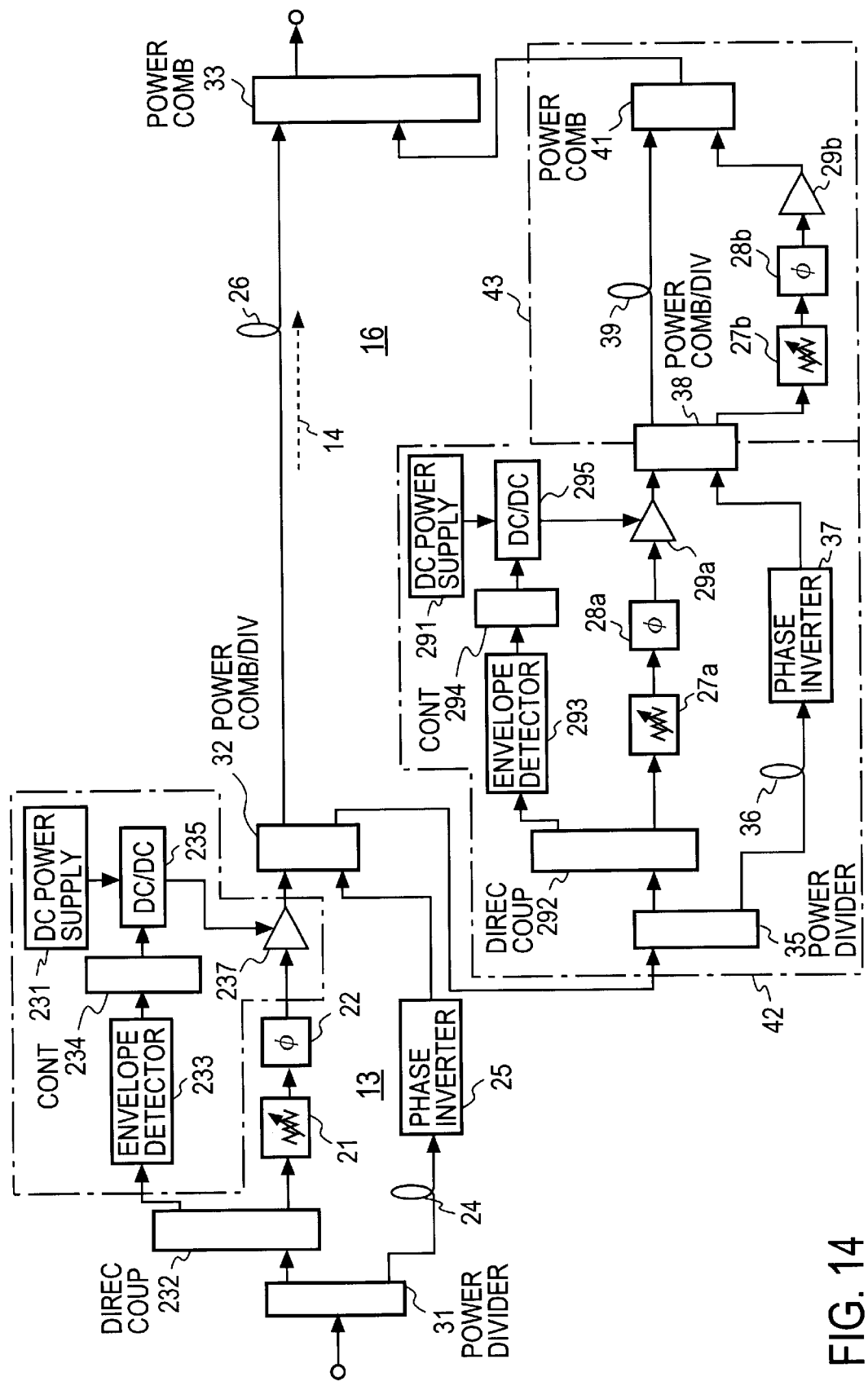
FIG. 14 is a block diagram depicting another embodiment of the combination of the first and third aspect of the present invention.

As shown in FIG. 14, the main amplifier 23 in the FIG. 13 embodiment may be configured to effect voltage control as in the case of the FIG. 8 embodiment. In this way, the voltages to be fed to the main amplifier 23 and the auxiliary amplifier 29a are controlled independently by different control circuits. As regards the voltage control method for the semiconductor amplifying device 237 forming the main amplifier 23 and the auxiliary amplifier 29a, either their drain or gate voltage may be controlled when they are formed by FETs. Moreover, their drain and gate voltages may be controlled at the same time. This permits optimization of the power-supply efficiency of the feedforward amplifier by combining optimum points for power efficiency by the drain voltage control and the gate voltage control. Similarly, when bipolar transistors are used, either their collector or base voltage may be controlled. And, the collector and base voltages may be controlled at the same time. In this case, too, it is possible to maximize the power-supply efficiency of the feedforward amplifier by combining optimum points for power efficiency by the drain voltage control and the gate voltage control.

As depicted in FIGS. 13 and 14, the voltage, which is to be applied to the collector or drain terminal, or base or gate terminal of the emitter- or source-grounded semiconductor amplifying device forming the auxiliary amplifier 29a of the auxiliary distortion detector 42, is controlled in accordance with the input signal to the auxiliary amplifier, by which it is possible to improve the power efficiency of he auxiliary amplifier without seriously impairing its power-supply efficiency, providing enhanced power-supply efficiency of the feedforward amplifier. Besides, the auxiliary amplifier (first auxiliary amplifier) 29a is enabled to perform a Class B, C, E or F high power efficiency operation other than by the Class A bias.

FOURTH EMBODIMENT

Incidentally, the above-mentioned distortion detector 13 and the distortion canceller 16 need controlling the variable attenuators and the variable phase shifters of their respective loops so that they produce signals which are equal in amplitude and in delay but 180° out-of-phase. In general, the amount of compression of nonlinear distortion of the feedforward amplifier depends on the balance of the loops that is provided by the regulation of the variable attenuators and the variable phase shifters. The accuracy of their adjustment or the like is described in Japanese Patent Application Laid-Open Gazette No. 1-198809 entitled "Automatic Regulation Circuit for Feedforward Amplifier." For instance, the phase and amplitude deviations required for obtaining an amount of distortion compression above 30 dB are less than ±2° and ±0.3 dB, respectively; therefore, it can be said that severe conditions are imposed on the balance of the transmission characteristics of the distortion detector and the distortion canceller and on the completeness of their regulation. In practice, it is difficult to keep perfect balance of each of the distortion detector and the distortion canceller. Even if their initialization is perfect, extreme difficulty is encountered in stably maintaining them in an excellent state of balance for a long time because the characteristics of the amplifier vary with changes in the ambient temperature, the power-supply voltage and so on.

To keep the distortion detector and the distortion canceller of the feedforward amplifier in a perfect state of balance with high accuracy, there has been proposed, for example, in the above-mentioned Japanese Patent Application Laid-Open Gazette No. 1-198809, an automatic regulation method using pilot signals. An actual implementation of such a method is disclosed in Toshio Nojima and Shouich Narahashi, "Ultra-low Distortion, Multi-frequency Common Amplifier . . . Self-Adjusting Feedforward Amplifier (SAFF-A)," Technical Report of Institute of Electronics, Information and Communication Engineers of Japan, RCS90-4, 1990.

Any of such automatic regulation methods are applied to the feedforward amplifier of the type that suppresses the nonlinear distortion component caused by the main amplifier. In the fourth embodiment of the invention described below the feedforward amplifier that has the aforementioned feedforward-structured distortion injection path for high efficiency amplification is adapted to be self-adjustable through the use of pilot signals.

Figure 15:
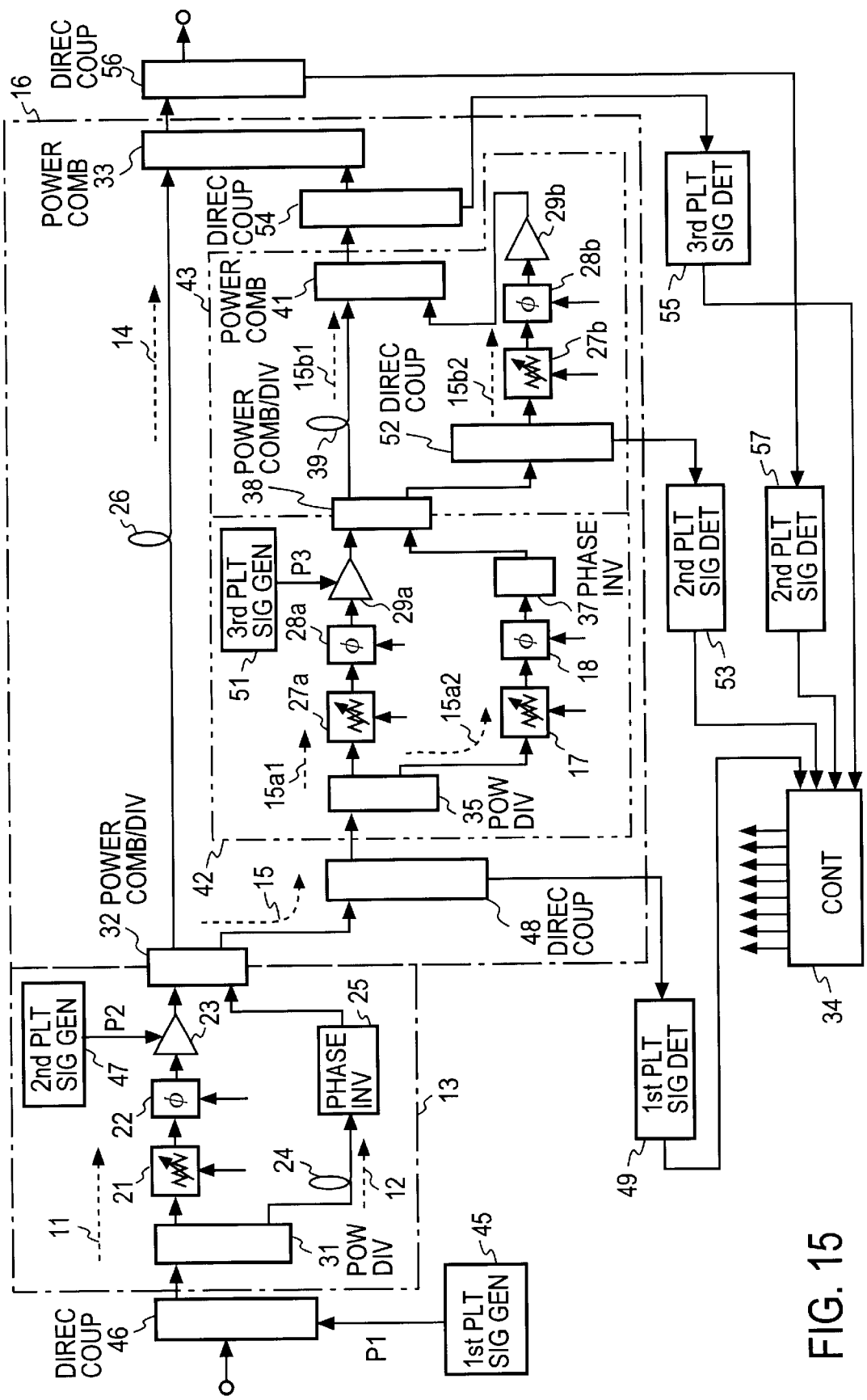
FIG. 15 is a block diagram illustrating a modified form of the FIG. 2 embodiment provided with a balance regulating structure.

FIG. 15 illustrates in block form the fourth embodiment of the present invention, which uses three pilot signals to adjust the balance of the loop of each of the distortion detector 13, the distortion canceller 16, the auxiliary distortion detector 42 and the auxiliary distortion canceller 43. The feedforward amplifier of this embodiment further includes in the FIG. 2 configuration: a first pilot generator 45 for generating a first pilot signal P1 on the amplifier input side; a directional coupler 46 for injecting the first pilot signal P1 into the amplifier input; a second pilot generator 47 for generating a second pilot signal P2 which is injected into between the stages of the main amplifier 23; a directional coupler 48 for extracting the first pilot signal P1 from the distortion injection path 15; a first pilot signal detector 49 for detecting the level of the first pilot signal P1 extracted by the directional coupler 48; a variable attenuator 17 and a variable phase shifter 18 inserted in a first auxiliary linear path 15a 2 of the auxiliary distortion detector 42 in the auxiliary feedforward amplifier forming the auxiliary amplifier; a third pilot generator 51 for injecting a third pilot signal P3 into between the stages of the first auxiliary amplifier 29a; a directional coupler 52 for extracting the second pilot signal P2 from a distortion injection path 15b 2 of the auxiliary feedforward amplifier; a second pilot signal detector 53 for detecting the level of the second pilot signal extracted by the directional coupler 52; a directional coupler 54 for extracting the third pilot signal P3 from the output of the auxiliary feedforward amplifier; a directional coupler 56 for extracting the second pilot signal from the output of the power combiner 33; a second pilot signal detector 57 for detecting the level of the second pilot signal extracted by the directional coupler 56; and a controller 34 for controlling pairs of variable attenuators and variable phase shifters 21–22, 27a –28a, 27b –28b and 17–18 in a manner to minimize the levels of the pilot signals detected by the first pilot signal detector 49, the second pilot signal detectors 53 and 57 and the third pilot signal detector 55.

The auxiliary distortion detector 42 comprises: a first auxiliary amplifier path 15a 1 made up of the variable attenuator 27a, the variable phase shifter 28a and the first auxiliary amplifier 29a; and the first auxiliary linear path 15a 2 made up of the variable attenuator 17, the variable phase shifter 18 and the phase inverter 37. And the auxiliary distortion detector 42 detects the distortion component that occurs in the first auxiliary amplifier 29a. The distortion canceller 43 comprises: a second auxiliary linear path 15b 1 containing the delay line 39; and an auxiliary distortion injection path 15b 2 containing the variable attenuator 27b, the variable phase shifter 28b and the second auxiliary amplifier 29b. The distortion canceller 43 injects the distortion component detected by the auxiliary distortion detector 42 into the power combiner 41 via the second auxiliary amplifier 29b in such a manner that the distortion component is opposite in phase and equal in amplitude and in delay to the distortion component in the second auxiliary linear path 15b I, thereby suppressing the distortion component caused by the first auxiliary amplifier 29a.

With such a feedforward-structured auxiliary amplifier 29 of the distortion injection path 15, the semiconductor amplifying device forming the first auxiliary amplifier 29a can be operated with high efficiency under a (Class B, C, E, or F) operating condition other than the Class A bias condition, and the distortion component newly caused by the first auxiliary amplifier 29a as the result of the high efficiency operation is detected by the auxiliary distortion detector 42, and the detected distortion component is used in the auxiliary distortion canceller 43 to cancel that distortion component in the amplified output from the first auxiliary amplifier 29a which has been produced by the amplifier 29a. Hence, the first auxiliary amplifier 29a is enabled to perform high power efficiency amplification.

The variable attenuator 17 and the variable phase shifter 18 newly provided in the auxiliary distortion detector 42 are intended to independently adjust the balance of the loop of the distortion canceller 16 which is made up of the path 14 containing the delay line 26 and the paths 15a 1 to 15b 1 containing the variable attenuator 27a, the variable phase shifter 28a, the first auxiliary amplifier 29a and the delay line 39, and the loop of the auxiliary distortion detector 42.

In the feeforward amplifier of this embodiment, three pilot signals are used to balance the loop of each of the distortion detector 13, the auxiliary distortion detector 42, the auxiliary distortion canceller 43 and the distortion canceller 16 as described below.

Step 1: The first pilot signal P1 from the first pilot generator 45 is applied to the distortion detector 13 via the directional coupler 46 provided at the input side of the feedforward amplifier. The first pilot signal P1 detected as distortion is extracted by the directional coupler 48 inserted in the distortion injection path 15, and the level of the extracted pilot signal P1 is detected by the first pilot signal detector 49. The controller 34 controls the amount of attenuation of the variable attenuator 21 and the amount of phase shift of the variable phase shifter 22 in such a manner as to minimize the detected level of the first pilot signal P1, thereby attaining the balance of the loop of the distortion detector 13.

Step 2: The second pilot signal P2 from the second pilot generator 47 is injected into the main amplifier 23, the second pilot signal P2 detected as distortion by the auxiliary distortion detector 42 is extracted by the directional coupler 52 inserted in the distortion injection path 15b 2, and the level of the extracted second pilot signal is detected by the second pilot signal detector 53. The controller 34 controls the variable attenuator 17 and the variable phase shifter 18 in such a manner as to minimize the detected level of the second pilot signal P2, thereby attaining the balance of the loop of the auxiliary distortion detector 42. The relationship (difference in value) between the amounts of attenuation of the variable attenuators 27a and 17 and the relationship (difference in value) between the amounts of phase shift of the variable phase shifters 28a and 18 at this time are preserved.

Step 3: The third pilot signal P3 from the third pilot generator 51 is injected into the first auxiliary amplifier 29a, the level of the third pilot signal P3 extracted by the directional coupler 54 provided at the output side of the auxiliary distortion canceller 43 is detected by the third pilot signal detector 33, and the controller 34 controls the variable attenuator 27b and the variable phase shifter 28b in such a manner as to minimize the detected level of the third pilot signal P3, thereby attaining the balance of the loop of the auxiliary distortion canceller 43.

Step 4: The second pilot signal P2 is injected into the main amplifier 23, and the level of the second pilot signal P2 extracted by the directional coupler 56 provided at the output side of the feedforward amplifier is detected by the second pilot signal detector 57. The variable attenuator 27a and the variable phase shifter 28a are controlled by the controller 34 so that the detected level of the second pilot signal P2 is minimized; at this time, the variable attenuator 17 and the variable phase shifter 18 are also controlled in such a manner as to keep unchanged their relationships with the variable attenuator 27a and the variable phase shifter 28a preserved in step 2.

The above-mentioned steps 2, 3 and 4 may be repeated.

For example, when the main amplifier 23 and the first auxiliary amplifier 29a are each formed by the multi-stage amplifying devices shown in FIG. 10 or 12, the second and third pilot signals are injected thereinto by one inter-stage matching circuit 2375, for instance, connected between the amplifying devices. In concrete terms, since the inter-stage matching circuit is usually formed by a series connection of input and output matching circuits, the pilot signal needs only to be injected to their connection point.

Figure 16:
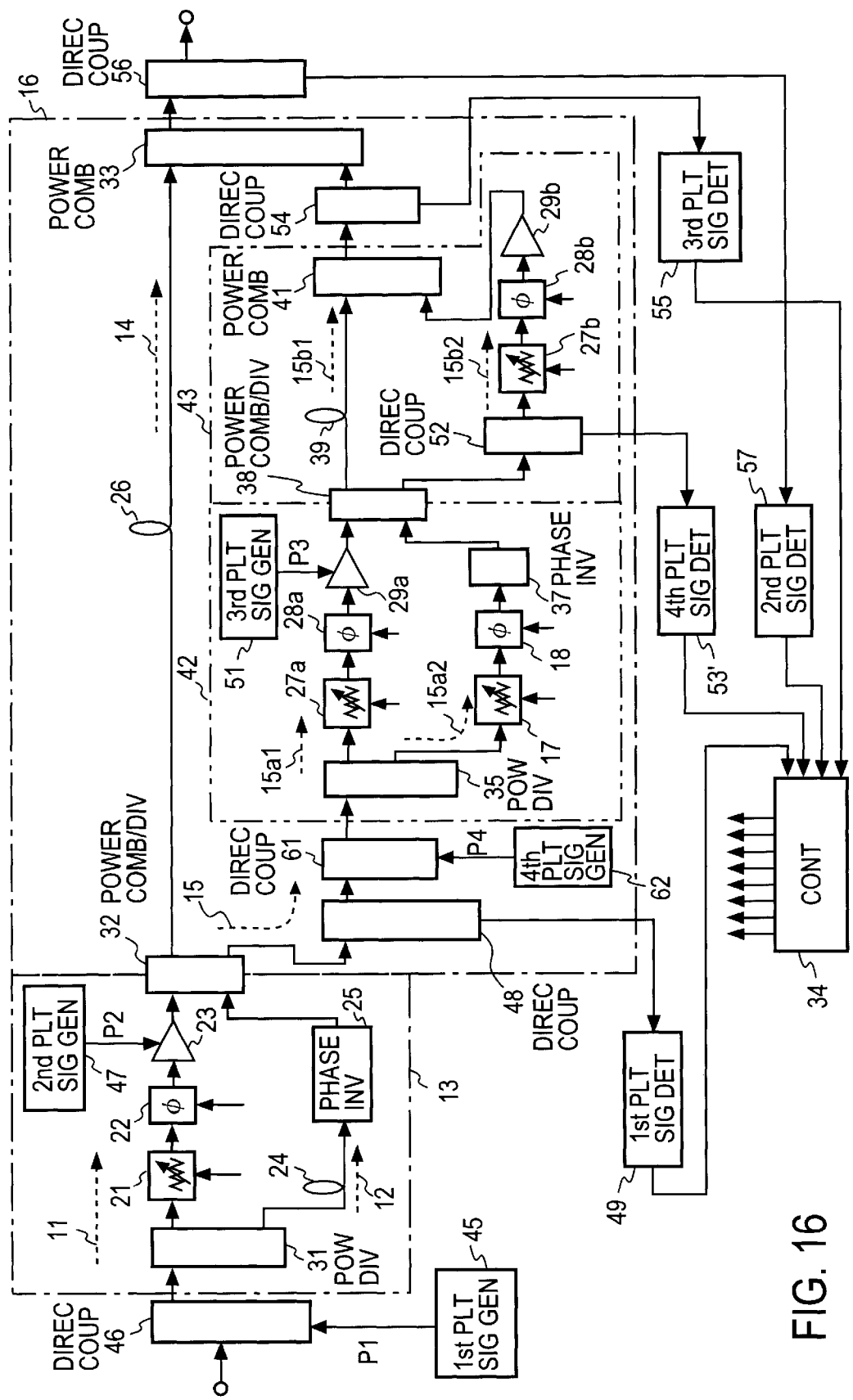
FIG. 16 is a block diagram depicting a modified form of the FIG. 15 example.

FIG. 16 illustrates in block form another embodiment which uses four pilot signals to regulate the balance of the respective loops, the parts corresponding to those in FIG. 15 being identified by the same reference numerals. While the FIG. 15 embodiment uses the second pilot signal for regulating the both loops of the distortion canceller 16 and the auxiliary distortion canceller 42, but this embodiment newly employs for regulating the loop of of he auxiliary distortion detector 42 a fourth pilot generator 62 for generating a fourth pilot signal P4, a directional coupler 61 for applying the fourth pilot signal P4 to the input of the auxiliary distortion detector 42, and a fourth pilot signal detector 53' as a substitute for the second pilot signal detector 53 in FIG. 15.

The fourth pilot signal P4 from the fourth pilot generator 64 is fed via the directional coupler 51 into the power divider 35 of the auxiliary distortion detector 42. The fourth pilot signs is extracted by the directional coupler 52, and the level of the fourth pilot signal P4 is detected by the fourth pilot signal detector 53'. The controller 34 controls the variable attenuator 17 and the variable phase shifter 18 in such a manner as to minimize the level of the detected level of the fourth pilot signal P4. This embodiment is identical in construction with the FIG. 15 embodiment except the above.

As described above, the feedforward amplifier of the FIG. 16 embodiment uses the four pilot signals to attain the balance of the loops of the distortion detector 13, the auxiliary distortion detector 42, the auxiliary distortion canceller 43 and the distortion canceller 16. The order of regulation is the same as in the case of the FIG. 15 embodiment.

Figure 17:
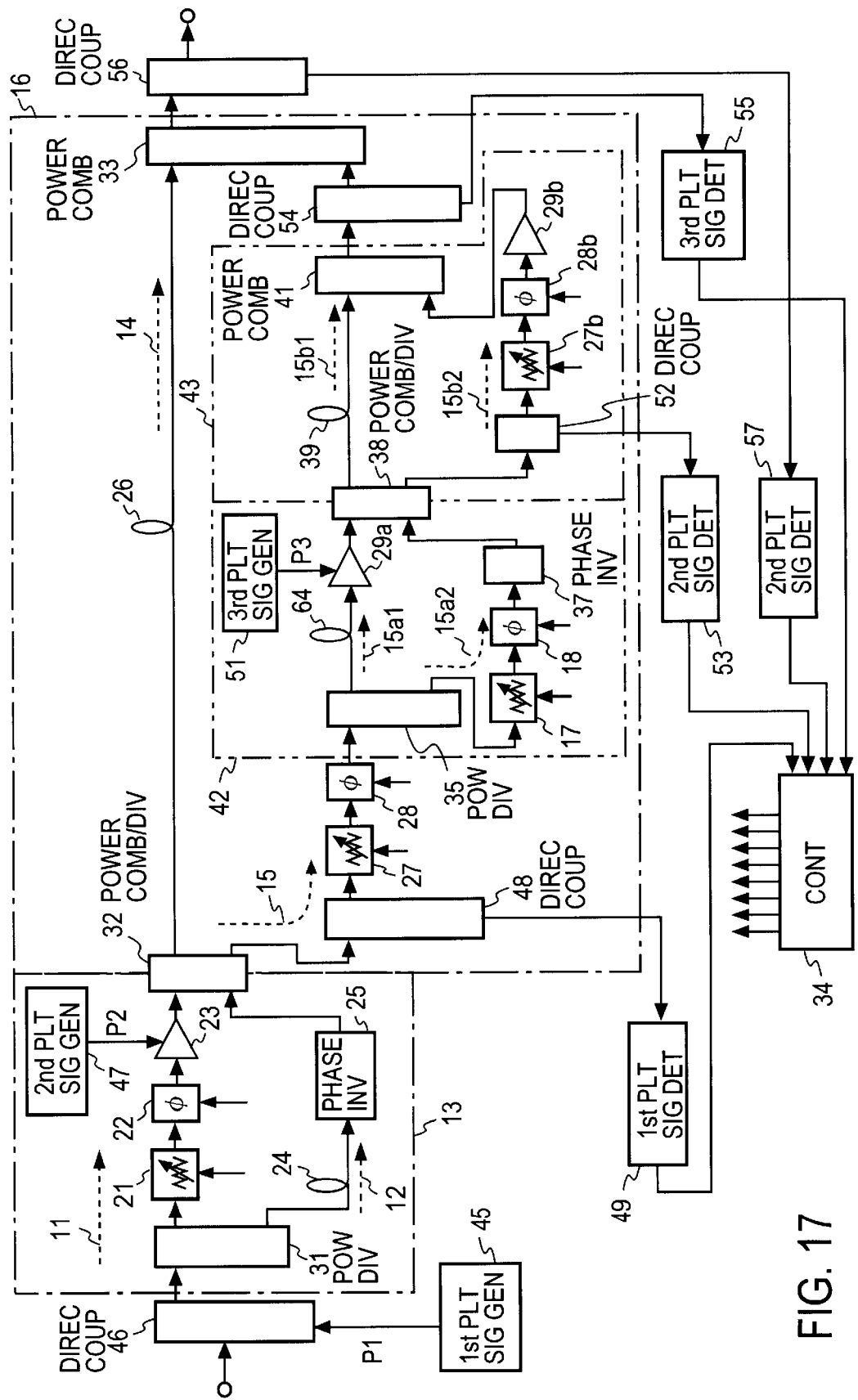
FIG. 17 is a block diagram depicting another modified form of the FIG. 15 example.

FIG. 17 illustrates in block form another modification of the FIG. 15 embodiment, in which the parts corresponding to those in FIG. 15 are identified by the same reference numerals. In the feedforward amplifier of this embodiment, the variable attenuator 27 and the variable phase shifter 28 for regulating the balance of the loop of the distortion canceller 16 are inserted in the distortion injection path 15 outside the feedforward-structured auxiliary amplifier (42+43), not in the auxiliary amplifier path 15a 1. The distortion component divided by the power combiner/divider 32 is provided via the variable attenuator 27 and the variable phase shifter 28 to the power divider 35 of the auxiliary distortion detector 42. The one of two signals divided by the power divider 35 is provided to the first auxiliary amplifier path 15a 1 containing the delay line 64 and the first auxiliary amplifier 29a, and the other signal is provided to the first auxiliary linear path 1512 containing the variable attenuator 17, the variable phase shifter 18 and the phase inverter 37. The outputs from these two paths are applied to the power combiner/divider 38. This embodiment is identical in construction with the FIG. 15 embodiment except the above.

The feedforward amplifier of this embodiment uses the following procedure to regulate the balance of the loop of each of the distortion detector 14, the distortion canceller 16, the auxiliary distortion detector 42 and the auxiliary distortion canceller 43 through the use of three pilot signals.

Step 1: The first pilot signal P1 from the first pilot generator 45 is applied to the distortion detector 13 via the directional coupler 46 provided at the input side of the feedforward amplifier. The first pilot signal P1 detected as distortion is extracted by the directional coupler 48 inserted in the distortion injection path 15, and the level of the extracted first pilot signal is detected by the first pilot signal detector 49. The controller 34 controls the amount of attenuation of the variable attenuator 21 and the amount of phase shift of the variable phase shifter 22 in a manner to minimize the detected level of the first pilot signal P1, balancing the loop of the distortion detector 13.

Step 2: The second pilot signal P2 from the second pilot generator 47 is injected into the main amplifier 23, then the second pilot signal detected as distortion by the distortion detector 42 is extracted by the directional coupler 52 inserted in the auxiliary distortion injection path 15b 2, and the level of the extracted second pilot signal P2 is detected by the second pilot signal detector 53. The controller 34 controls the variable attenuator 17 and the variable phase shifter 18 in a manner to minimize the detected level of the second pilot signal P2, there by balancing the loop of the auxiliary distortion detector 42.

Step 3: The third pilot signal P3 from the third pilot generator 51 is injected into the first auxiliary amplifier 29a, then the level of the third pilot signal P3 extracted by the directional coupler 54 provided at the output side of the auxiliary distortion canceller 43 is detected by the third pilot signal detector 55, and the variable attenuator 27b and the variable phase shifter 28b are controlled by the controller 34 in a manner to minimize the detected level of the third pilot signal P3, thereby balancing the loop of the auxiliary distortion canceller 43.

Step 4: The second pilot signal P2 is injected into the main amplifier 23, and the level of the second pilot signal P2 extracted by the directional coupler 56 provided at the output side of the feedforward amplifier is detected by the second pilot signal detector 57. The variable attenuator 27a and the variable phase shifter 28a are controlled by the controller 34 in a manner to minimize the detected level of the second pilot signal P2, thereby balancing the loop of the distortion detector 16.

As described above, the variable attenuator 27a and the variable phase shifter 28a in the embodiments of the FIGS. 15 and 16 are removed from the first auxiliary amplifier paths 15a 1 of the auxiliary distortion detector 42, but instead the variable attenuator 27 and the variable phase shifter 28 are inserted in the input side of the auxiliary distortion detector 42; hence, the balance of the auxiliary distortion detector 42 is not destroyed even by the control of the variable attenuator 27 and the variable phase shifter 28 based on the detected level of the second pilot signal P2. Accordingly, the balance of the respective loops can be adjusted independently of one another.

Figure 18:
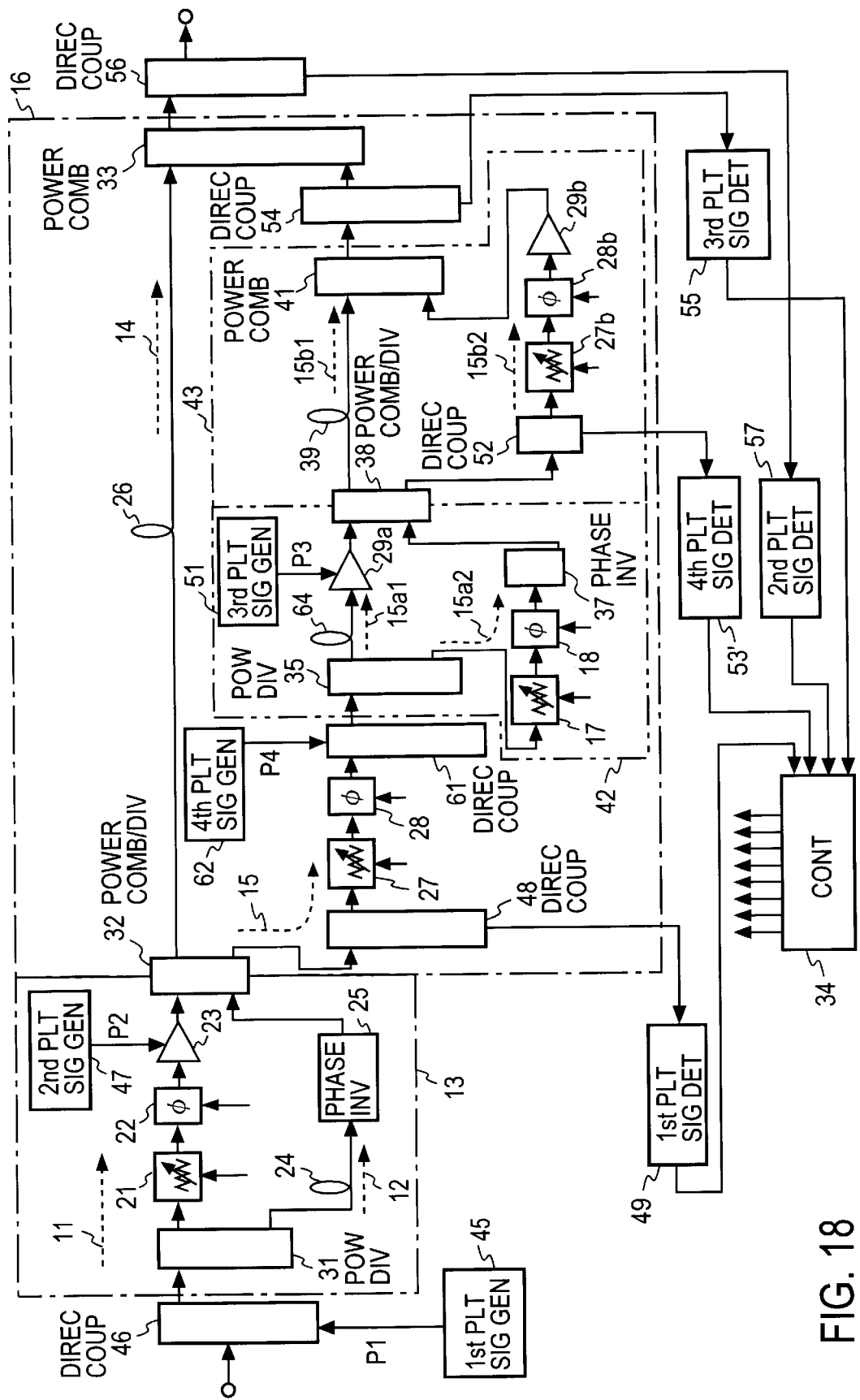
FIG. 18 is a block diagram depicting still another modified form of the FIG. 15 example.

FIG. 18 illustrates a modified form of the FIG. 17 embodiment, which uses the fourth pilot signal as a substitute for the second pilot signal to adjust the balance of the loop of the auxiliary distortion detector 42 as in the FIG. 16 embodiment. The parts corresponding to those in FIG. 17 are marked with the same reference numerals. In the FIG. 18 embodiment the directional coupler 61 is inserted between the variable phase shifter 28 and the power divider 35, and the fourth pilot signal P4 from the fourth pilot generator 62 is fed via the directional coupler 61 to the power divider 35. The level of the fourth pilot signal P4 provided via the directional coupler 52 is detected by the fourth pilot signal detector 53', and the variable attenuator 17 and the variable phase shifter 18 are controlled by the controller 34 so that the detected level of the fourth pilot signal P4 becomes minimized. This embodiment is identical with the FIG. 17 embodiment in the other respects.

In the feedforward amplifier of this embodiment, since the variable attenuator 17 and the variable phase shifter 18 as the loop adjusting means for the auxiliary distortion detector 42 are used independently of the variable attenuator 27 and the variable phase shifter 28 as the loop adjusting means for the distortion detector 16 as is the case with the FIG. 17 embodiment, the loops of the auxiliary distortion detector 42 and distortion canceller 16 can be balanced independent of each other.

As described above, in the embodiments of FIGS. 15 to 18 the auxiliary amplifiers can be made highly efficient amplification by the feedforward structured distortion injection path, and the distortion component resulting from the high efficiency amplification can be suppressed. With the feedforward structure of the distortion injection path, the variable attenuator and the variable phase shifter of each of the four loops are controlled by one of the four pilot signals in a manner to minimize the signal level to thereby attain the balance of the loop-this permits compensation of the distortion component by the main amplifier and the distortion component by the first auxiliary amplifier, and hence enables the semiconductor amplifying device forming the first auxiliary amplifier to operate under the high efficiency amplification condition other than the Class A bias condition.

FIFTH EMBODIMENT

In the embodiments of FIGS. 15 through 18 the arrangement for adjusting each loop is additionally provided in the embodiment in which the auxiliary amplifier of the distortion canceller 16 is formed by a feedforward amplifier, but the loop adjusting arrangement can be added to the embodiments of FIGS. 3, 8 and 9 simply by using a known method. This will be described below.

Figure 19:
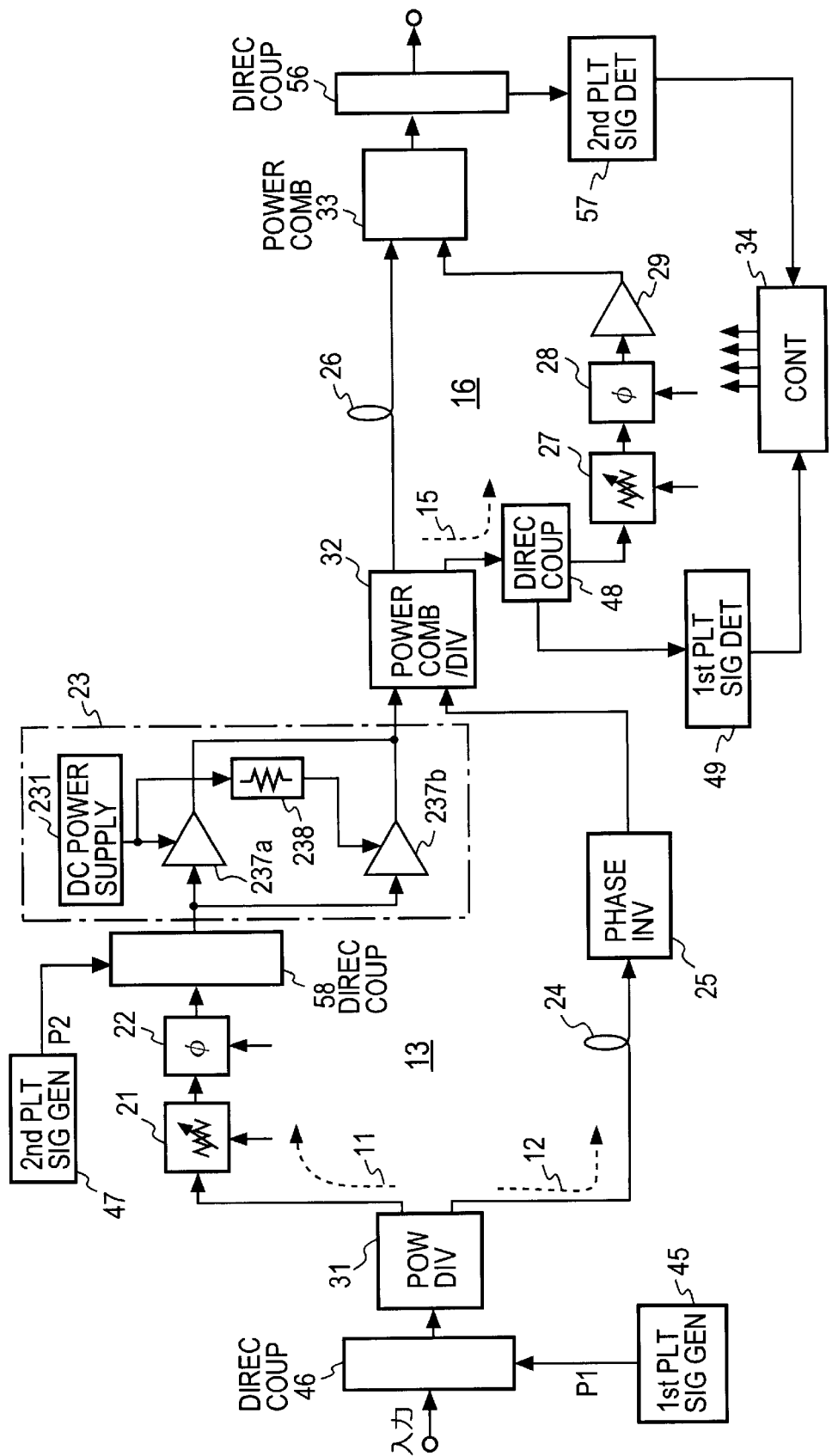
FIG. 19 is a block diagram illustrating a modified form of the FIG. 3 embodiment additionally provided with a loop balance adjusting structure using first and second pilot signals.

FIG. 19 depicts in block form an embodiment adapted to adjust the balance of loops by using the first and second pilot signal in the FIG. 3 embodiment. The first pilot signal P1 from the first pilot generator 45 is applied via the directional coupler 46 to the power divider 31. The directional coupler 48 inserted in the distortion injection path 15 of the distortion canceller 16 extracts the first pilot signal P1, then the first pilot signal detector 49 the level of the first pilot signal P1, and the controller 34 controls the variable attenuator 21 and the variable phase shifter 21. Next, the second pilot signal P2 from the second pilot generator 47 is applied to the main amplifier 23 via a directional coupler 58 inserted in the input side of the main amplifier 23. The directional coupler 56 inserted in the output side of the power combiner 33 extracts the second pilot signal P2, and the second pilot signal detector 57 detects the level of the second pilot signal P2. The controller 34 controls the variable attenuator 27 and the variable phase shifter 28 so that the detected level of the second pilot signal P2 becomes minimized.

Figure 20:
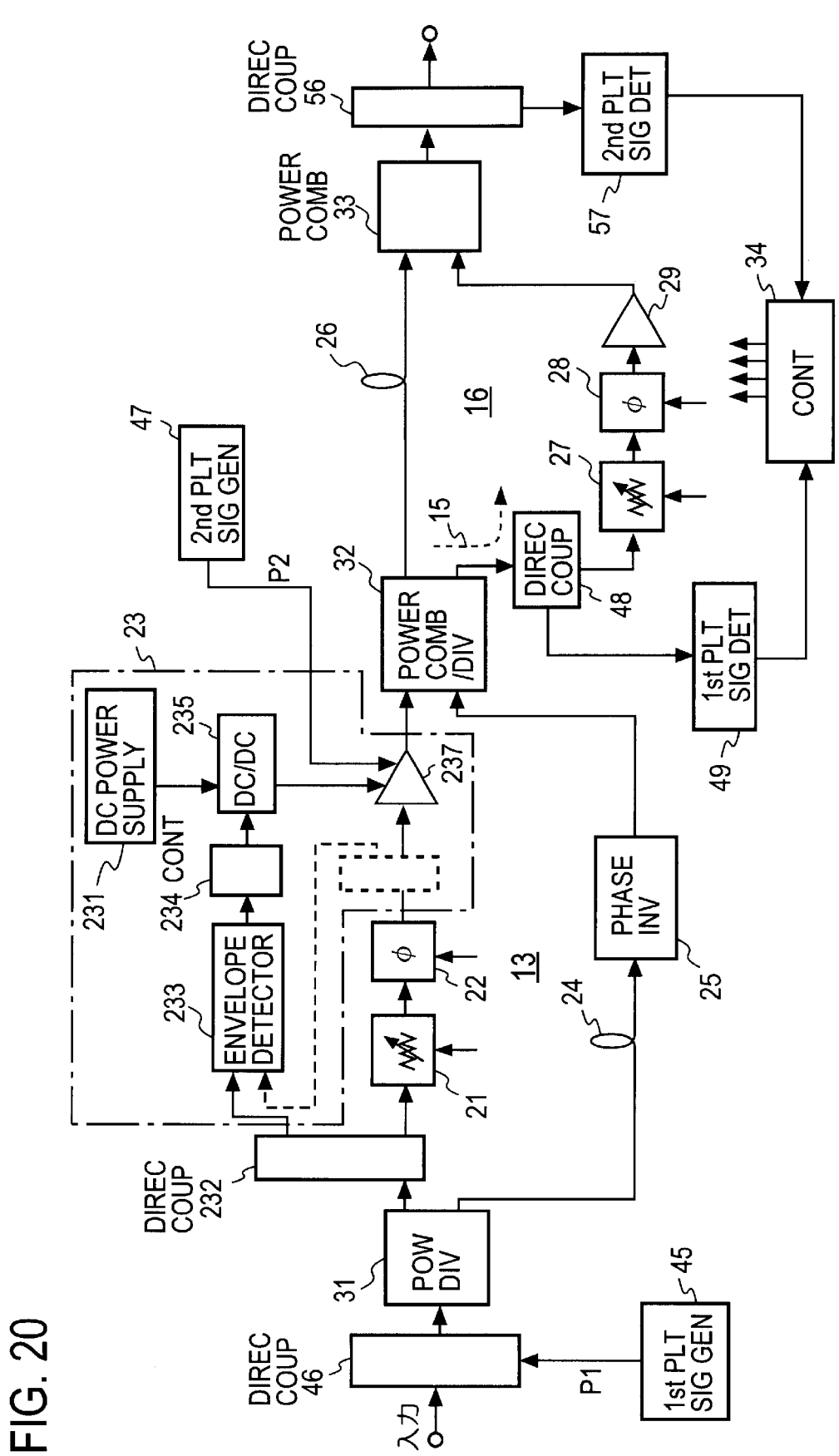
FIG. 20 is a block diagram illustrating a modified form of the FIG. 8 embodiment additionally provided with the loop balance adjusting structure using first and second pilot signals.

FIG. 20 illustrates in block form an embodiment in which the arrangement for adjusting the balance of loops by the first and second pilot signals as in the FIG. 19 embodiment is added to the FIG. 8 embodiment. In this embodiment the saturation voltage of one amplifier 237 is controlled by the input signal envelope and the second pilot signal is injected into the amplifier 237. The balance of each loop is adjusted in the same manner as in the case of FIG. 19, and hence no description will be repeated. The FIG. 9 embodiment can also be added with the arrangement for controlling the balance of the loops of the distortion detector 13 and the distortion canceller 16 through the use of the first and second pilot signals.

The control algorithm of the control part 34 in each of the embodiments of FIGS. 15 to 20 may be implemented by a conventional perturbation, least square estimation or similar adaptive algorithm. In general, the balance of the loop of the feedforward amplifier varies with changes in the power-supply voltage, the device temperature and so on. The hour rate of such variations is relatively low. On this account even a control algorithm that takes much time to converge to the optimum value is sufficiently applicable to the control of the feedforward amplifier according to the present invention.

In the embodiments described above, the variable attenuator is formed by a circuit which contains an device whose resistance value is electrically controllable, such as a voltage-variable resistor, and the variable phase shifter is also formed by a circuit which contains an device whose capacitance is electrically controllable, such as a voltage-variable capacitance device. These variable attenuator and variable phase shifter are electrically controlled by the control part 34 following a control program which performs the aforementioned control procedure.

In the embodiments of FIGS. 15 to 18 and 20, the second pilot signal P2 is injected into between the stages of the main amplifier 23; this method is the simplest and hence is preferable. Theoretically the second pilot signal P2 may be injected anywhere into the main amplifier path 11, but if not between the stages of the main amplifier 23, the pilot signal may preferably be supplied to the input side of the main amplifier 23 via a directional coupler as depicted in FIG. 19. The third pilot signal P3 in the embodiments of FIGS. 15 to 18 may also be injected anywhere into the auxiliary amplifier path 15a 1.

The pilot signals P1, P2, P3 (and P4) in FIGS. 15 to 20 may be non-modulated waves set at different frequencies, carriers of the same frequency but modulated by different modulating waves, or modulated versions of the same carrier but spread by different spreading codes. A pilot signal detector for the pilot signal using the non-modulated wave is formed by a narrow-band level detector of the type that limits the pilot signal, for example, by a band-pass filter and detects the filter output by a diode or similar level detector. A pilot signal detector for the pilot signal using the modulated wave is formed by a frequency converter for frequency converting the band of the pilot signal to the base band and a demodulator for demodulating the frequency-converted base band signal. As compared with the pilot signal using the nonmodulated wave, the pilot signal using the modulated wave allows the application of equalization, error correction and similar processing to various kinds of interference and noise. Hence, each loop can be balanced with less pilot signal power. A pilot signal detector for the pilot signal using the spreading code comprises a frequency converter for frequency converting the band of the pilot signal to the base band, a despreader for dispreading the frequency converted base band signal and a demodulator for demodulating the despread signal. Thus, the automatic adjuster of the feedforward amplifier according to the present invention is applicable to various kinds of pilot signals.

EFFECT OF THE INVENTION

As described above, according to the first aspect of the present invention, the feedforward-structured auxiliary amplifier of the feedforward amplifier is cable of suppressing the distortion component generated by the auxiliary amplifier. Hence, even if the first auxiliary amplifier of the auxiliary feedforward amplifier is caused to perform high efficiency amplification other than the Class A operation, the resulting distortion can be cancelled. Accordingly, a high power-supply efficiency feedforward amplifier can be implemented.

According to the second aspect of the present invention, the main amplifier of the feedforward amplifier is configured to have a plurality of amplification characteristics, which are switched in accordance with the input signal to provide increased power-supply efficiency.

Thus, the feedforward amplifier according to the first and/or second aspect of the present invention can be made lower power consumption and hence enables the amplifier device to be miniaturized accordingly.

What is claimed is:

1. A feedforward amplifier which detects a distortion component of an amplifier output and injects said distortion component into an amplifier output to cancel said distortion component, said feedforward amplifier comprising:

a main-amplifier distortion detector made up of: a main-amplifier path containing a main amplifier, for amplifying and transferring an input signal thereto; a first linear path for transferring said input signal linearly; a main-amplifier power divider for branching said input signal to said paths; and a power combiner/divider for combining the outputs from said main-amplifier path and said first linear path and for outputting the sum component and the difference component of said combined outputs as a main-amplifier main signal component and a main-amplifier distortion component, respectively; and a main-amplifier distortion canceller made up of: a second linear path supplied with said main signal component, for transferring it linearly; a main-amplifier distortion injection path containing auxiliary amplifying means, for amplifying and transferring said main-amplifier distortion component; and a main-amplifier power combiner for combining the output of said second linear path with the output of said main-amplifier distortion injection path;

wherein said auxiliary amplifying means comprises:
an auxiliary-amplifier distortion detector made up of: an auxiliary-amplifier power divider for dividing said main-amplifier distortion component into two; an auxiliary-amplifier path containing a first auxiliary amplifier, for amplifying and transferring one of said two divided main-amplifier distortion components; a third linear path for linearly the other of said two divided main-amplifier distortion components; and an auxiliary-amplifier power combiner/divided for combining the outputs of said auxiliary-amplifier path and said third linear path and for outputting the sum component and the difference component of said combined outputs as an auxiliary-amplifier main signal component and an auxiliary-amplifier distortion component, respectively; and an auxiliary-amplifier distortion canceller made up of: a fourth linear path supplied with said auxiliary-amplifier main signal component from said auxiliary-amplifier power combiner/divider, for linearly transferring said auxiliary-amplifier main signal component; an auxiliary-amplifier distortion injection path supplied with said auxiliary-amplifier distortion component from said auxiliary-amplifier power combiner/divider, for amplifying and transferring said auxiliary-amplifier distortion component; and an auxiliary-amplifier power combiner for combining the outputs of said fourth linear path and said auxiliary-amplifier distortion injection path and for providing said combined output as the output of said main-amplifier injection path to said main-amplifier power combiner.

2. A feedforward amplifier which detects a distortion component of an amplifier output and injects said distortion component into an amplifier output to cancel said distortion component, said feedforward amplifier comprising:

a main-amplifier distortion detector made up of: a main-amplifier path containing a main amplifier, for amplifying and transferring an input signal thereto; a first linear path for transferring said input signal linearly; a main-amplifier power divider for branching said input signal to said paths; and a power combiner/divider for combining the outputs from said main-amplifier path and said first linear path and for outputting the sum component and the difference component of said combined outputs as a main-amplifier main signal component and a main-amplifier distortion component, respectively; and a main-amplifier distortion canceller made up of: a second linear path supplied with said main signal component, for transferring it linearly; a main-amplifier distortion injection path containing auxiliary amplifying means, for amplifying and transferring said main-amplifier distortion component; and a main-amplifier power combiner for combining the output of said second linear path with the output of said main-amplifier distortion injection path;

wherein said main amplifier has a plurality of amplification characteristics; and wherein said main amplifier comprises: a source- or emitter-grounded main-amplifier semiconductor amplifying device for amplifying a signal of said main-amplifier path; a main-amplifier voltage converter for changing the voltage to be applied to a drain or collector terminal of said main-amplifier semiconductor amplifying device; a main-amplifier detector for detecting an envelope component of a signal to be fed to said main amplifier; and a main-amplifier control circuit for controlling said main-amplifier voltage converter in accordance with the output signal of said main-amplifier detector to change the voltage to be applied to said drain or collector terminal of said main-amplifier semiconductor amplifying device to change said amplification characteristic, thereby providing said plurality of amplification characteristics.

3. A feedforward amplifier which detects a distortion component of an amplifier output and injects said distortion component into an amplifier output to cancel said distortion component, said feedforward amplifier comprising:

a main-amplifier distortion detector made up of: a main-amplifier path containing a main amplifier, for amplifying and transferring an input signal thereto; a first linear path for transferring said input signal linearly; a main-amplifier power divider for branching said input signal to said paths; and a power combiner/divider for combining the outputs from said main- amplifier path and said first linear path and for outputting the sum component and the difference component of said combined outputs as a main-amplifier main signal component and a main-amplifier distortion component, respectively; and a main-amplifier distortion canceller made up of: a second linear path supplied with said main signal component, for transferring it linearly; a main-amplifier distortion injection path containing auxiliary amplifying means, for amplifying and transferring said main-amplifier distortion component; and a main-amplifier power combiner for combining the output of said second linear path with the output of said main-amplifier distortion injection path;

wherein said main amplifier has a plurality of amplification characteristics; and wherein said main amplifier comprises: a source- or emitter-grounded main-amplifier semiconductor amplifying device for amplifying a signal of said main-amplifier path; a main-amplifier voltage converter for changing the voltage to be applied to a gate or base terminal of said main-amplifier semiconductor amplifying device; a main-amplifier detector for detecting an envelope component of a signal to be fed to said main amplifier; and a main-amplifier control circuit for controlling said main-amplifier voltage converter in accordance with the output signal of said main-amplifier detector to change the voltage to be applied to said gate or base terminal of said main-amplifier semiconductor amplifying device to change said amplification characteristic, thereby providing said plurality of amplification characteristics.

4. A feedforward amplifier which detects a distortion component of an amplifier output and injects said distortion component into an amplifier output to cancel said distortion component, said feedforward amplifier comprising:

a main-amplifier distortion detector made up of: a main-amplifier path containing a main amplifier, for amplifying and transferring an input signal thereto; a first linear path for transferring said input signal linearly; a main-amplifier power divider for branching said input signal to said paths; and a power combiner/divider for combining the outputs from said main- amplifier path and said first linear path and for outputting the sum component and the difference component of said combined outputs as a main-amplifier main signal component and a main-amplifier distortion component, respectively; and a main-amplifier distortion canceller made up of: a second linear path supplied with said main signal component, for transferring it linearly; a main-amplifier distortion injection path containing auxiliary amplifying means, for amplifying and transferring said main-amplifier distortion component; and a main-amplifier power combiner for combining the output of said second linear path with the output of said main-amplifier distortion injection path;

wherein said main amplifier has a plurality of amplification characteristics; and wherein said auxiliary amplifying means comprises:

an auxiliary-amplifier distortion detector made up of: an auxiliary-amplifier power divider for dividing said main-amplifier distortion component into two; an auxiliary-amplifier path containing a first auxiliary amplifier, for amplifying and transferring one of said two divided main-amplifier distortion components; a third linear path for linearly transferring the other of said two divided main-amplifier distortion components; and an auxiliary-amplifier power combiner/divider for combining the outputs of said auxiliary-amplifier path and said third linear path and for outputting the sum component and the difference component of said combined outputs as an auxiliary-amplifier main signal component and an auxiliary-amplifier distortion component, respectively; and an auxiliary-amplifier distortion canceller made up of: a fourth linear path supplied with said auxiliary-amplifier main signal component from said auxiliary-amplifier power combiner/divider, for linearly transferring said auxiliary-amplifier main signal component; an auxiliary-amplifier distortion injection path supplied with said auxiliary-amplifier distortion component from said auxiliary-amplifier power combiner/divider, for amplifying and transferring said auxiliary-amplifier distortion component; and an auxiliary-amplifier power combiner for combining the outputs of said fourth linear path and said auxiliary-amplifier distortion injection path and for providing said combined output as the output of said main-amplifier injection path to said main-amplifier power combiner.

5. The feedforward amplifier of claim 2, 3, or 4, wherein said main amplifier comprises a parallel connection of plural amplifiers of different saturation outputs.

6. The feedforward amplifier of claim 3, wherein said main amplifier comprises: another source- or emitter-grounded main amplifier semiconductor amplifying device for amplifying a signal of said main-amplifier path; and another main-amplifier voltage converter for changing the voltage to be applied to a gate or base terminal of said another main-amplifier semiconductor amplifying device; and wherein said main-amplifier control circuit controls said main-amplifier voltage converter and said another main-amplifier voltage converter in accordance with the output signal of said main-amplifier detector to change the voltages to be applied to gate or base terminals of said main-amplifier semiconductor amplifying device and said another main-amplifier semiconductor amplifying device to change said amplification characteristic, thereby providing said plurality of amplification characteristics.

7. The feedforward amplifier of any one of claims 6, 2, or 3, wherein said auxiliary amplifying means comprises:

an auxiliary-amplifier distortion detector made up of: An auxiliary-amplifier power divider for dividing said main-amplifier distortion component into two; an auxiliary-amplifier path containing a first auxiliary amplifier, for amplifying and transferring one of said two divided main-amplifier distortion components; a third linear path for linearly transferring the other of said two divided main-amplifier distortion components; and an auxiliary-amplifier power combiner/divider for combining the outputs of said auxiliary-amplifier path and said third linear path and for outputting the sum component and the difference component of said combined outputs as an auxiliary-amplifier main signal component and an auxiliary-amplifier distortion component, respectively; and an auxiliary-amplifier distortion canceller made up of: a fourth linear path supplied with said auxiliary-amplifier main signal component from said auxiliary-amplifier power combiner/divider, for linearly transferring said auxiliary-amplifier main signal component; an auxiliary-amplifier distortion injection path supplied with said auxiliary-amplifier distortion component from said auxiliary-amplifier combiner/divider, for amplifying and transferring said auxiliary-amplifier distortion component; and an auxiliary-amplifier power combiner for combining the outputs of said fourth linear path and said auxiliary-amplifier distortion injection path and for providing said combined output as the output of said main-amplifier injection path to said main-amplifier power combiner.

8. The feedforward amplifier of claim 2, 3, or 4, wherein said first auxiliary amplifier comprises a parallel connection of plural amplifiers of different saturation outputs.

9. The feedforward amplifier of claim 2, 3, or 4, wherein said first auxiliary amplifier comprises: a source- or emitter-grounded auxiliary-amplifier semiconductor amplifying device for amplifying a signal of said auxiliary-amplifier path; an auxiliary-amplifier voltage converter for changing the voltage to be applied to a drain or collector terminal of said auxiliary-amplifier semiconductor amplifying device; an auxiliary-amplifier detector for detecting an envelope component of a signal to be fed to said first auxiliary amplifier; and an auxiliary-amplifier control circuit for controlling said auxiliary-amplifier voltage converter in accordance with the output signal of said auxiliary-amplifier detector to change the voltage to be applied to said drain or collector terminal of said auxiliary-amplifier semiconductor amplifying device to change the amplification characteristic of said auxiliary amplifier semiconductor amplifying device.

10. The feedforward amplifier of claim 2, 3, or 4, wherein said first auxiliary amplifier comprises: a source- or emitter-grounded auxiliary-amplifier semiconductor amplifying device for amplifying a signal of said auxiliary-amplifier path; an auxiliary-amplifier voltage converter for changing the voltage to be applied to a gate or base terminal of said auxiliary-amplifier semiconductor amplifying device; an auxiliary-amplifier detector for detecting an envelope component of a signal to be fed to said first auxiliary amplifier; and an auxiliary-amplifier control circuit for controlling said auxiliary-amplifier voltage converter in accordance with the output signal of said auxiliary-amplifier detector to change the voltage to be applied to said gate or base terminal of said auxiliary-amplifier semiconductor amplifying device to change the amplification characteristic of said auxiliary amplifier semiconductor amplifying device.

11. The feedforward amplifier of claim 10, wherein said auxiliary amplifier comprises: another source- or emitter-grounded auxiliary-amplifier semiconductor amplifying device for amplifying a signal of said auxiliary amplifier path; and another auxiliary-amplifier voltage converter for changing the voltage to be applied to a gate or base terminal of said another auxiliary-amplifier semiconductor amplifying device; and wherein said auxiliary-amplifier control circuit controls said auxiliary-amplifier voltage converter and said another auxiliary-amplifier voltage converter in accordance with the output signal of said auxiliary-amplifier detector to change the voltages to be applied to gate or base terminals of said auxiliary-amplifier semiconductor amplifying device and said another auxiliary-amplifier semiconductor amplifying device, thereby changing said amplification characteristic.

12. The feedforward amplifier of claim 1, further comprising:

first electrically variable attenuator means and first electrically variable phase shifter means inserted in said main-amplifier path;

second electrically variable attenuator means and second electrically variable phase shifter means inserted in said auxiliary-amplifier path;

third electrically variable attenuator means and third electrically variable phase shifter means inserted in said auxiliary-amplifier distortion injection path;

fourth electrically variable attenuator means and fourth electrically variable phase shifter means inserted in said third linear path;

means inserted in an input path to said main-amplifier distortion detector, for supplying thereto a first pilot signal;

first pilot signal detecting means inserted in an input path to said auxiliary-amplifier distortion detector, for detecting said first pilot signal;

means inserted in said main-amplifier path, for injecting thereinto a second pilot signal;

first second-pilot-signal detecting means inserted in an output path from said main-amplifier distortion canceller, for detecting said second pilot signal;

means inserted in said auxiliary-amplifier path, for injecting thereinto a third pilot signal;

third pilot signal detecting means inserted in an output path from said auxiliary-amplifier distortion canceller, for detecting said third pilot signal;

second second-pilot-signal detecting means inserted in said auxiliary-amplifier distortion injection path, for detecting said second pilot signal; and control means for controlling said first electrically variable attenuator means and said first electrically variable phase shifter means to minimize the level of said first pilot signal detected by said first pilot signal detecting means, for controlling said fourth electrically variable attenuator means and said fourth electrically variable phase shifter means to minimize the level of said second pilot signal detected by said second second-pilot-signal detecting means, for controlling said third electrically variable attenuator means and said third electrically variable phase shifter means to minimize the level of said third pilot signal detected by said third pilot signal detecting means, for controlling said second electrically variable attenuator means and said second electrically variable phase shifter means to minimize the level of said second pilot signal detected by said first second-pilot-signal detecting means, and for controlling the amounts of control of said second electrically variable attenuator means and said second electrically variable phase shifter means in association with said fourth electrically variable attenuator means and said fourth electrically variable phase shifter means, respectively.

13. The feedforward amplifier of claim 1, further comprising:

first electrically variable attenuator means and first electrically variable phase shifter means inserted in said main-amplifier path;

second electrically variable attenuator means and second electrically variable phase shifter means inserted in said auxiliary-amplifier path;

third electrically variable attenuator means and third electrically variable phase shifter means inserted in said auxiliary-amplifier distortion injection path;

fourth electrically variable attenuator means and fourth electrically variable phase shifter means inserted in said third linear path;

means inserted in an input path to said main-amplifier distortion detector, for supplying thereto a first pilot signal;

first pilot signal detecting means inserted in an input path to said auxiliary-amplifier distortion detector, for detecting said first pilot signal;

means inserted in said main-amplifier path, for injecting thereinto a second pilot signal;

second pilot signal detecting means inserted in an output path from said main-amplifier distortion canceller, for detecting said second pilot signal;

means inserted in said auxiliary-amplifier path, for injecting thereinto a third pilot signal;

third pilot signal detecting means inserted in an output path from said auxiliary-amplifier distortion canceller, for detecting said third pilot signal;

means inserted in said input path to said auxiliary-amplifier distortion detector, for supplying thereto a fourth pilot signal;

fourth pilot signal detecting means inserted in said auxiliary-amplifier distortion injection path, for detecting said fourth pilot signal; and control means for controlling said first electrically variable attenuator means and said first electrically variable phase shifter means to minimize the level of said first pilot signal detected by said first pilot signal detecting means, for controlling said fourth electrically variable attenuator means and said fourth electrically variable phase shifter means to minimize the level of said second pilot signal detected by said fourth pilot signal detecting means, for controlling said third electrically variable attenuator means and said third electrically variable phase shifter means to minimize the level of said third pilot signal detected by said third pilot signal detecting means, for controlling said second electrically variable attenuator means and said second electrically variable phase shifter means to minimize the level of said second pilot signal detected by said second pilot signal detecting means, and for controlling the amounts of control of said second electrically variable attenuator means and said second electrically variable phase shifter means in association with said fourth electrically variable attenuator means and said fourth electrically variable phase shifter means, respectively.

14. The feedforward amplifier of claim 1, further comprising:
- first electrically variable attenuator means and first electrically variable phase shifter means inserted in said main-amplifier path;
- second electrically variable attenuator means and second electrically variable phase shifter means inserted in an input path to said auxiliary-amplifier distortion detector;
- third electrically variable attenuator means and third electrically variable phase shifter means inserted in said auxiliary-amplifier distortion injection path;
- fourth electrically variable attenuator means and fourth electrically variable phase shifter means inserted in said third linear path;
- means inserted in an input path to said main-amplifier distortion detector, for supplying thereto a first pilot signal;
- first pilot signal detecting means inserted in said input path to said auxiliary-amplifier distortion detector, for detecting said first pilot signal;
- means inserted in said main-amplifier path, for injecting thereinto a second pilot signal;
- first second-pilot-signal detecting means inserted in an output path from said main-amplifier distortion canceller, for detecting said second pilot signal;
- means inserted in said auxiliary-amplifier path, for injecting thereinto a third pilot signal;
- third pilot signal detecting means inserted in an output path from said auxiliary-amplifier distortion canceller, for detecting said third pilot signal;
- second second-pilot-signal detecting means inserted in said auxiliary-amplifier distortion injection path, for detecting said second pilot signal; and
- control means for controlling said first electrically variable attenuator means and said first electrically variable phase shifter means to minimize the level of said first pilot signal detected by said first pilot signal detecting means, for controlling said fourth electrically variable attenuator means and said fourth electrically variable phase shifter means to minimize the level of said second pilot signal detected by said second second-pilot-signal detecting means, for controlling said third electrically variable attenuator means and said third electrically variable phase shifter means to minimize the level of said third pilot signal detected by said third pilot signal detecting means, and for controlling said second electrically variable attenuator means and said second electrically variable phase shifter means to minimize the level of said second pilot signal detected by said first second pilot signal detecting means.

15. The feedforward amplifier of claim 1, further comprising:
- first electrically variable attenuator means and first electrically variable phase shifter means inserted in said main-amplifier path;
- second electrically variable attenuator means and second electrically variable phase shifter means inserted in an input path to said auxiliary-amplifier distortion detector;
- third electrically variable attenuator means and third electrically variable phase shifter means inserted in said auxiliary-amplifier distortion injection path;
- fourth electrically variable attenuator means and fourth electrically variable phase shifter means inserted in said third linear path;
- means inserted in an input path to said main-amplifier distortion detector, for supplying thereto a first pilot signal;
- first pilot signal detecting means inserted in said input path to said auxiliary-amplifier distortion detector, for detecting said first pilot signal;
- means inserted in said main-amplifier path, for injecting thereinto a second pilot signal;
- second pilot signal detecting means inserted in an output path from said main-amplifier distortion canceller, for detecting said second pilot signal;
- means inserted in said auxiliary-amplifier path, for injecting thereinto a third pilot signal;
- third pilot signal detecting means inserted in an output path from said auxiliary-amplifier distortion canceller, for detecting said third pilot signal;
- means inserted in said input path to said auxiliary-amplifier distortion detector, for supplying thereto a fourth pilot signal;
- fourth pilot signal detecting means inserted in said auxiliary-amplifier distortion injection path, for detecting said fourth pilot signal; and
- control means for controlling said first electrically variable attenuator means and said first electrically variable phase shifter means to minimize the level of said first pilot signal detected by said first pilot signal detecting means, for controlling said fourth electrically variable attenuator means and said fourth electrically variable phase shifter means to minimize the level of said fourth pilot signal detected by said fourth pilot signal detecting means, for controlling said third electrically variable attenuator means and said third electrically variable phase shifter means to minimize the level of said third pilot signal detected by said third pilot signal detecting means, and for controlling said second electrically variable attenuator means and said second electrically variable phase shifter means to minimize the level of said second pilot signal detected by said second pilot signal detecting means.

16. The feedforward amplifier of claim 2, 3, or 4, wherein said main-amplifier contains a series of connection of a first variable attenuator and a first variable phase shifter, and said main-amplifier distortion injection path contains a series connection of a second variable attenuator and a second variable phase shifter.

17. The feedforward amplifier of claim 16, further comprising:
- means for supplying a first pilot signal to an input path to said main-amplifier distortion detector;
- means for injecting a second pilot signal into said main amplifier;
- first pilot signal detecting means for detecting said first pilot signal from said main-amplifier distortion injection path;
- second pilot signal detecting means for detecting said second pilot signal from an output path from said main-amplifier distortion canceller; and
- control means for controlling said first variable attenuator and said first variable phase shifter to minimize the level of said first pilot signal detected by said first pilot signal detecting means and for controlling the second variable attenuator an said second variable phase shifter to minimize the level of said second pilot signal detected by said second pilot signal detecting means.

* * * * *